US010215828B2

(12) United States Patent
Miyazaki et al.

(10) Patent No.: US 10,215,828 B2
(45) Date of Patent: Feb. 26, 2019

(54) MAGNETIC RESONANCE IMAGING APPARATUS

(71) Applicant: TOSHIBA MEDICAL SYSTEMS CORPORATION, Otawara-shi (JP)

(72) Inventors: Mitsue Miyazaki, Des Plaines, IL (US); Cheng Ouyang, Vernon Hills, IL (US); Xiangzhi Zhou, Vernon Hills, IL (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1053 days.

(21) Appl. No.: 14/470,137

(22) Filed: Aug. 27, 2014

(65) Prior Publication Data

US 2014/0361776 A1 Dec. 11, 2014

Related U.S. Application Data

(63) Continuation-in-part of application No. 13/601,723, filed on Aug. 31, 2012, now Pat. No. 9,547,058, and (Continued)

(30) Foreign Application Priority Data

Aug. 29, 2013 (JP) .................................. 2013-178662

(51) Int. Cl.
*G01R 33/56* (2006.01)
*G01R 33/50* (2006.01)
(Continued)

(52) U.S. Cl.
CPC ......... *G01R 33/5605* (2013.01); *G01R 33/50* (2013.01); *G01R 33/4816* (2013.01); *G01R 33/543* (2013.01); *G01R 33/5608* (2013.01)

(58) Field of Classification Search
CPC .... G01R 33/5605; G01R 33/50; G01R 33/54; G01R 33/4816; G01R 33/4828; G01R 33/543; G01R 33/546; G01R 33/5608
See application file for complete search history.

(56) References Cited

U.S. PATENT DOCUMENTS 9,121,917 B2 * 9/2015 Song ................... G01R 33/5601
2002/0169372 A1 * 11/2002 Miyazaki ............. G01R 33/563
600/410

(Continued)

FOREIGN PATENT DOCUMENTS

JP 11-313810 11/1999
JP 2002-248092 9/2002

OTHER PUBLICATIONS

Yarnykh, Vasily L. "Pulsed Z-spectroscopic imaging of cross-relaxation parameters in tissues for human MRI: Theory and clinical applications." Magnetic resonance in medicine 47.5 (2002): 929-939.*

(Continued)

*Primary Examiner* — Rishi R Patel
(74) *Attorney, Agent, or Firm* — Nixon & Vanderhye P.C.

(57) ABSTRACT

A magnetic resonance imaging apparatus includes a sequence controller. The sequence controller is configured to apply MT (Magnetization Transfer) pulses having a frequency different from a resonance frequency of free water protons and then acquires magnetic resonance signals of an object to be imaged. The sequence controller acquires the magnetic resonance signals for each of multiple frequencies while changing the frequency of MT pulses within a frequency band based on a T2 relaxation time of restricted protons contained in the object to be imaged.

13 Claims, 17 Drawing Sheets

Related U.S. Application Data a continuation-in-part of application No. 13/705,582, filed on Dec. 5, 2012, now Pat. No. 9,562,959.

(51) Int. Cl.
*G01R 33/48* (2006.01)
*G01R 33/54* (2006.01)

(56) References Cited

U.S. PATENT DOCUMENTS

| | | | |
|---|---|---|---|
| 2013/0190601 A1* | 7/2013 | Alsop | G01R 33/5601 600/410 |
| 2014/0062473 A1 | 3/2014 | Miyazaki et al. | |
| 2014/0062476 A1 | 3/2014 | Miyazaki et al. | |
| 2014/0361776 A1 | 12/2014 | Miyazaki et al. | |
| 2015/0141804 A1 | 5/2015 | Rooney et al. | |
| 2015/0247908 A1 | 9/2015 | Liu et al. | |

OTHER PUBLICATIONS

Wolff, et al., "Magnetization Transfer Contrast (MTC) and Tissue Water Proton Relaxation in Vivo," Magnetic Resonance in Medicine, vol. 10, pp. 135-144 (1989).
Zhou, et al., "Chemical exchange saturation transfer imaging and spectroscopy," Progress in Nuclear Magnetic Resonance Spectroscopy, vol. 48, pp. 109-136 (2006).
van Zijl, et al., "Chemical Exchange Saturation Transfer (CEST): What is in a Name and What Isn't?," Magnetic Resonance in Medicine, vol. 65, pp. 927-948 (2011).
Constable, et al., "The Loss of Small Objects in Variable TE Imaging: Implications for FSE, RARE, and EPI," Magnetic Resonance in Medicine, vol. 28, pp. 9-24 (1992).
Balaban, et al., "Magnetization Transfer Contrast in Magnetic Resonance Imaging," *Magnetic Resonance Quarterly,* vol. 8, No. 2, pp. 116-137 (1992).
Bottomley, et al., "Anatomy and Metabolism of the Normal Human Brain Studied by Magnetic Resonance at 1.5 Tesla," *Radiology,* vol. 150, pp. 441-446 (1984).
Fralix, et al., "Lipid Bilayer and Water Proton Magnetization Transfer: Effect of Cholesterol," *Magn. Reson. Med.,* vol. 18, pp. 214-223 (1991).
Koenig, "Cholesterol of Myelin is the Determinant of Grey-White Contrast in MRI of Brain," *Magn. Reson. Med.,* vol. 20, pp. 285-291 (1991).
Koenig, et al., "Relaxometry of Brain: Why White Matter Appears Bright in MRI," *Magn. Reson. Med.,* vol. 14, pp. 482-495 (1990).
Pike, et al., "Magnetization Transfer Time-of-Flight Magnetic Resonance Angiography," *Magn. Reson. Med.,* vol. 25, pp. 372-379 (1992).
Ward, et al., "A New Class of Contrast Agents for MRI Based on Proton Chemical Exchange Dependent Saturation Transfer (CEST)," *J. Magn. Reson.,* vol. 143, pp. 79-87 (2000).
International Search Report dated Sep. 24, 2013 in PCT/JP2013/073234.
V. L. Yarnykh et. al., "Macromolecular proton fraction mapping of the human liver in vivo: technical feasibility and preliminary observations in hepatic fibrosis," Proc. Intl. Soc. Mag. Reson. Med. 19 (2011), Jul. 13, 2011, p. 392.
R. Scheidegger, et al., "Quantitative modeling of in-vivo amide proton transfer measurements in the human brain indicates a dominant signal contribution from proteins with short T2 relaxation times," Proc. Intl. Soc. Mag. Reson. Med. 19 (2011), Jul. 13, 2011, p. 2768.
J. Hua, et al., "Quantitative Description of Magnetization Transfer (MT) Asymmetry in Experimental Brain Tumors," Proc. Intl. Soc. Mag. Reson. Med. 15 (2007), May 19, 2007, p. 882.
Office Action dated Mar. 2, 2016 in U.S. Appl. No. 13/601,723.
Extended European Search Report dated Oct. 27, 2017 in EP 13832858.8.
G. J. Stanisz et al., "Characterizing White Matter with Magnetization Transfer and $T_2$," Magnetic Resonance in Medicine, vol. 42, No. 6, Nov. 23, 1999, pp. 1128-1136.
Wu J. Y. et al., "Evolution of polymer mobility during ageing of gelatinized waxy maize starch: a magnetization transfer $^1$H NMR study," Carbohydrate Polymers, Applied Science Publishers, Ltd. Barking, GB, vol. 20, No. 1, Jan. 1, 1993, pp. 51-60.
De Boer R. W., "Magnetization transfer contrast. Part 1: MR Physics," Medica Mundi: A Review of Modern Healthcare Solutions, Philips Healthcare, NL, vol. 40, Jan. 1, 1995, pp. 64-73.
Mitsue Miyazaki et al., "Z-Spectrum Analysis Provides Proton Environment Data (Zapped): A New Two-Pool Technique for Human Gray and White Matter," PLOS ONE I, vol. 10, No. 3, Mar. 13, 2015, p. e0119915, DOI: 10.1371/journal.pone.0119915.

* cited by examiner

Hz OR PPM
FWHM = 1/$T_2$ OF RESTRICTED OR MACROMOLECULAR ENVIRONMENT

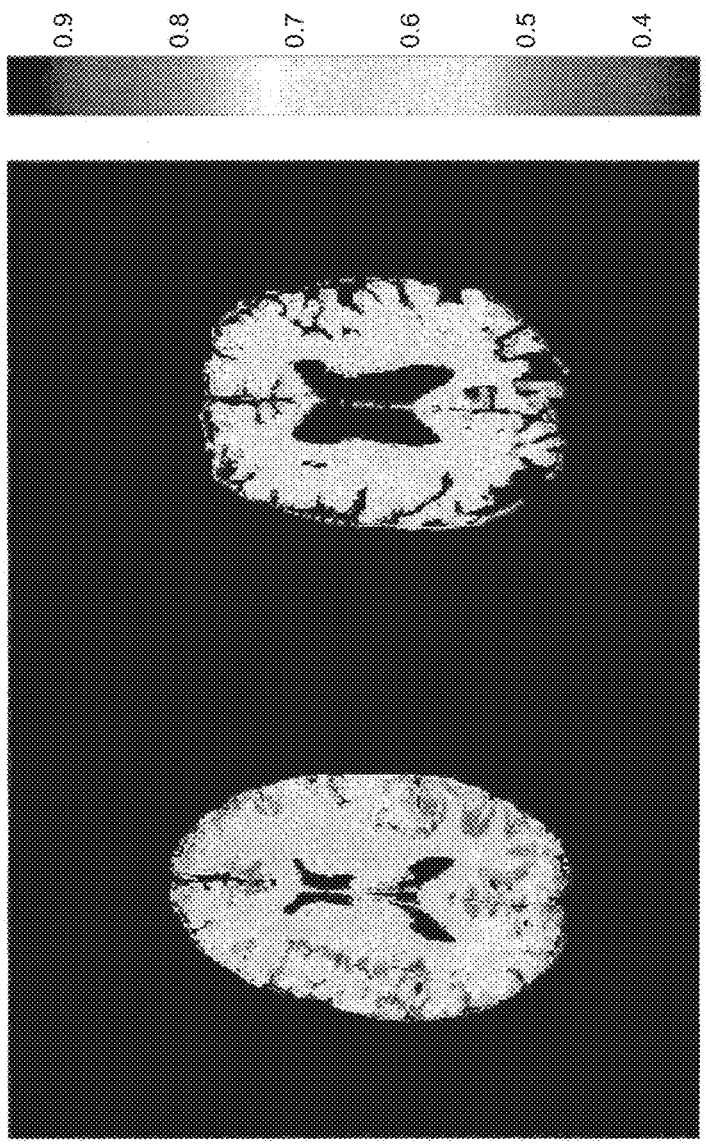

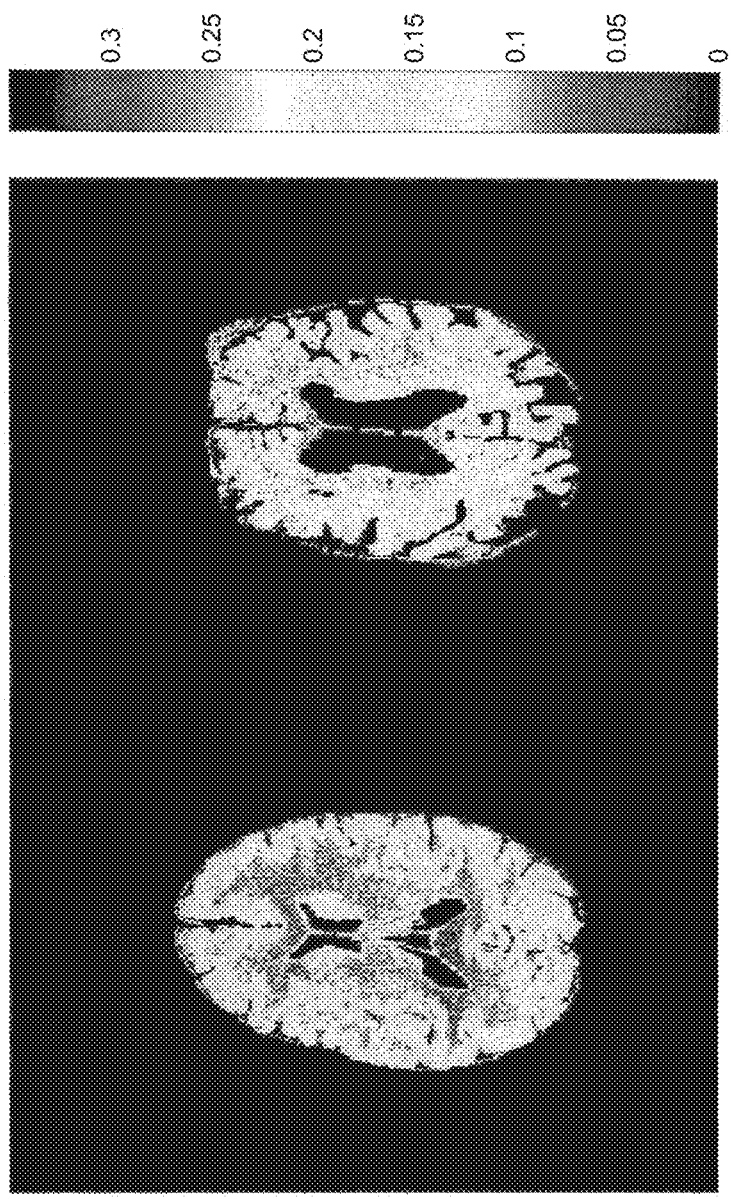

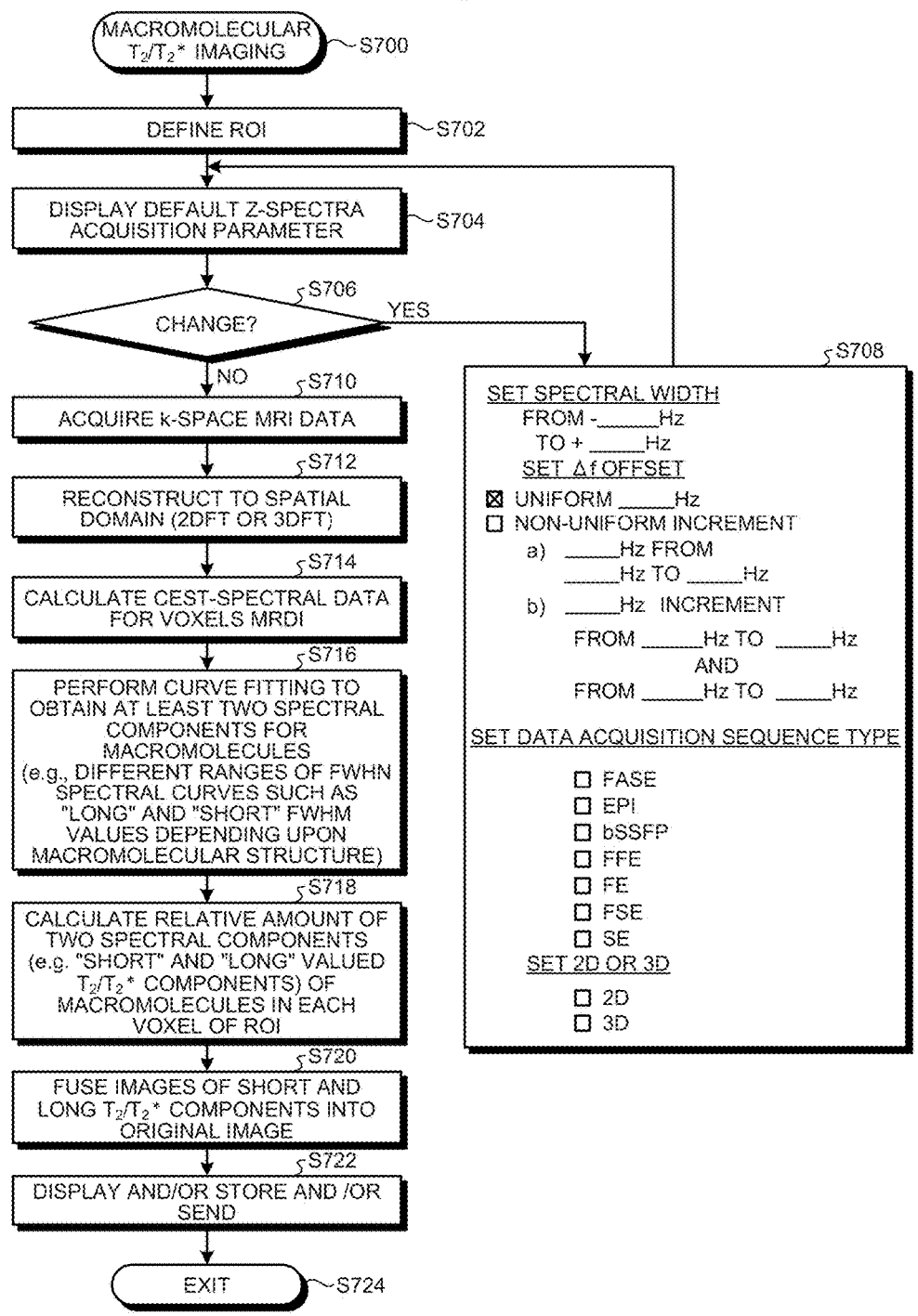

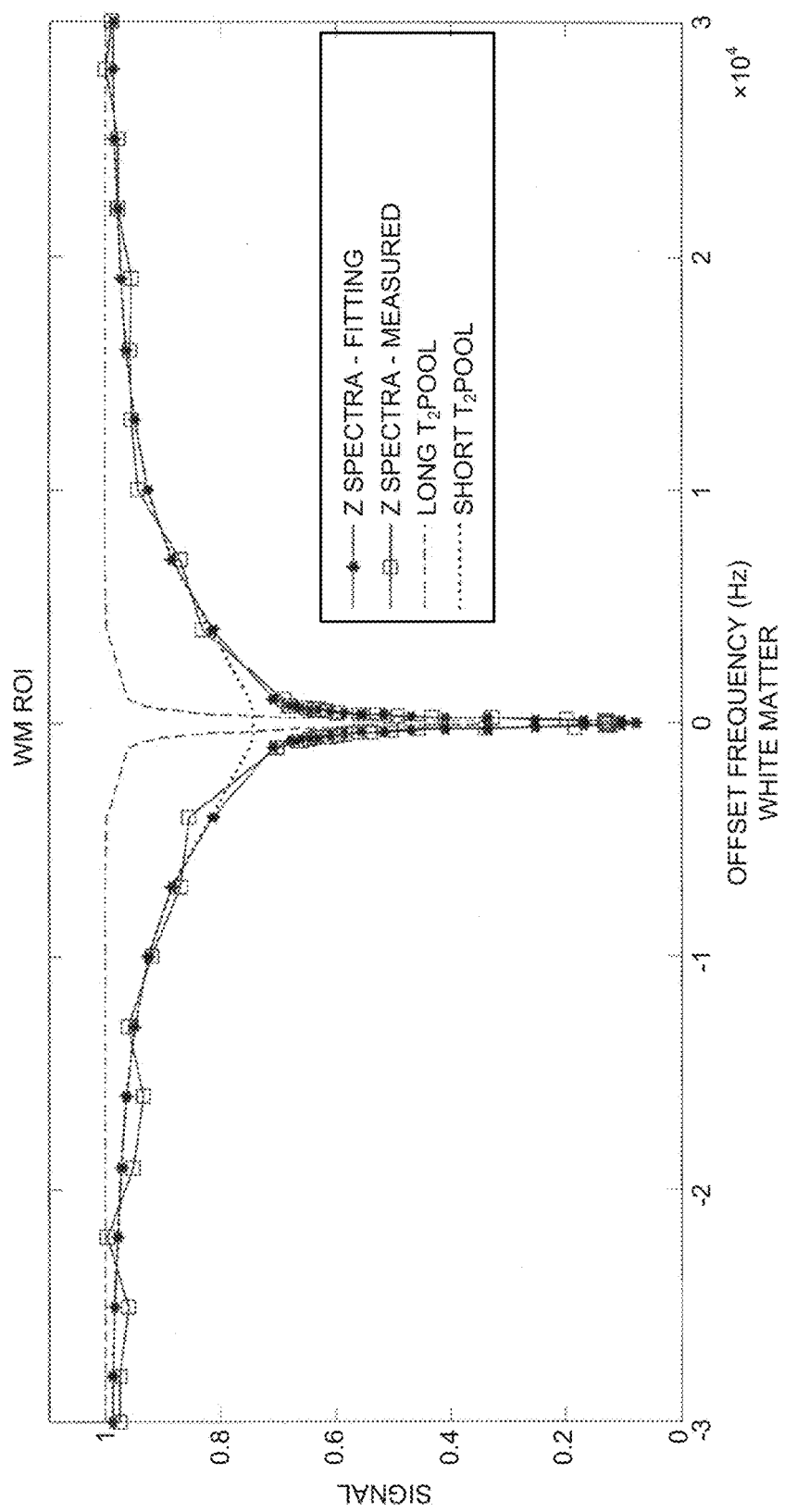

W1 (Hz)

W2 (Hz)

FIG.13
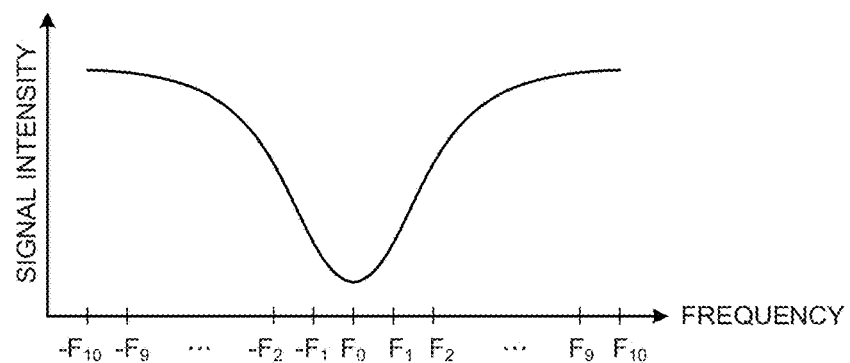
(a)  $-F_{10}$ ⇨ $-F_9$ ⋯ $-F_1$ ⇨ $F_0$ ⇨ $+F_1$ ⋯ $+F_9$ ⇨ $+F_{10}$
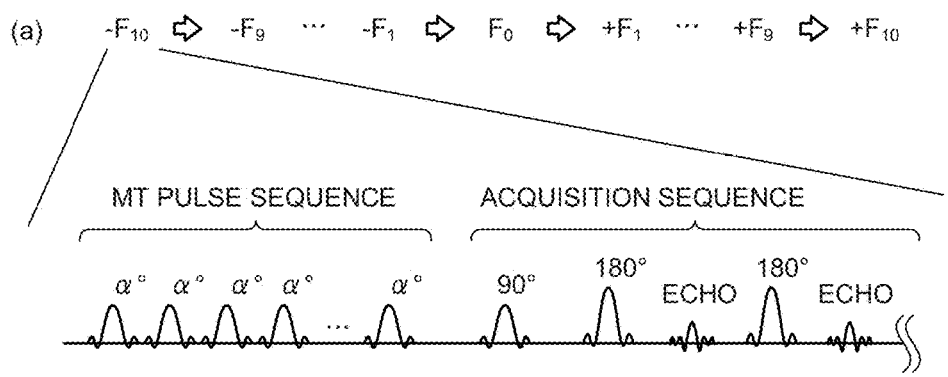
(b)  $-F_{10}$ ⇨ $-F_9$ ⇨ ⋯ $-F_1$ ⇨ $F_0$
(c)  $F_0$ ⇨ $-F_1$ ⇨ ⋯ $-F_9$ ⇨ $-F_{10}$
(d)  $-F_{10}$ ⇨ $+F_{10}$ ⇨ $-F_9$ ⇨ $+F_9$ ⇨ ⋯ $-F_1$ ⇨ $+F_1$ ⇨ $F_0$
(e)  $-F_{10}$ ⇨ $F_0$ ⇨ $-F_9$ ⇨ $-F_1$ ⇨ $-F_8$ ⇨ $-F_2$ ⋯

MAGNETIC RESONANCE IMAGING APPARATUS

CROSS-REFERENCE TO RELATED APPLICATIONS

This application is a continuation-in-part (CIP) of application Ser. No. 13/601,723 filed on Aug. 31, 2012 now issued on Jan. 1, 2017 as U.S. Pat. No. 9,547,058, and application Ser. No. 13/705,582 filed on Dec. 5, 2012 now issued on Feb. 7, 2017 as U.S. Pat. No. 9,562,959, the entire content of which is hereby incorporated by reference in this application. This application is based upon and claims the benefit of priority from Japanese Patent Application No. 2013-178662, filed on Aug. 29, 2013, the entire contents of all of which are incorporated herein by reference.

FIELD

Embodiments relate to a magnetic resonance imaging apparatus.

BACKGROUND

Conventional magnetic resonance imaging includes methods referred to as MTC (Magnetization Transfer Contrast) effects and CEST (Chemical Exchange Saturation Transfer). Protons in living tissues include free water protons and restricted protons whose motion is restricted when bound with macromolecules. The MTC effects use magnetic transfer between free water protons and restricted protons. The principle is as follows: first, MT pulses having a resonance frequency different from the resonance frequency of free water protons are applied so as to restrict the signals of restricted protons. The restricted protons are exchanged with the surrounding free-water protons and thus the magnetization of the restricted protons whose signals have been suppressed is transferred to the free water protons, which reduces signals of the free water protons. CEST is targeting magnetization transfer between restricted protons having a specific frequency (e.g., amine and hydroxyl group protons) and free water protons.

BRIEF DESCRIPTION OF DRAWINGS

FIG. 5 presents images for young and senior volunteers showing relative amplitudes of the long T2/T2* pool.

FIG. 6 presents images for the young and senior volunteers showing relative amplitudes of ultra-short T2/T2* pool.

FIG. 7 is a flowchart representing a computer program code structure for implementing an exemplary embodiment of automated MRI detection of living tissue macromolecular T2/T2* characteristics using S-spectra.

FIG. 8B is a diagram representing Z-spectra of white matter and curve fitting of short T2es and long T2el exchangeable protons.

FIG. 13 is a diagram for describing the pulse sequences implemented in the exemplary embodiment.

DESCRIPTION OF EMBODIMENTS

A magnetic resonance imaging apparatus according to an exemplary embodiment includes a sequence controller. The sequence controller is configured to apply MT (Magnetization Transfer) pulses having a frequency different from a resonance frequency of free water protons and then acquire magnetic resonance signals of an object to be imaged, wherein the sequence controller acquires the magnetic resonance signals for each of multiple frequencies while changing the frequency of the MT pulses within a frequency band based on a T2 relaxation time of restricted protons contained in the object to be imaged. The magnetic resonance imaging apparatus (hereinafter, "MRI (Magnetic Resonance Imaging) system" as appropriate) according to embodiments will be described with reference to the drawings. Embodiments are not limited to the following ones. The contents of descriptions of an embodiment can be similarly applied to other embodiments in principle. "T2" and "$T_2$" both mean spin-spin relaxation. While real T2 relaxation time is denoted as "T2e", in the case where it cannot be referred to as real T2 relaxation time due to, for example, restriction of TR (Repetition Time), distinction is made by denoting as, "T2/T2*", etc. However, such distinction is not strict and the embodiments can be applied to both cases.

Figure 1:
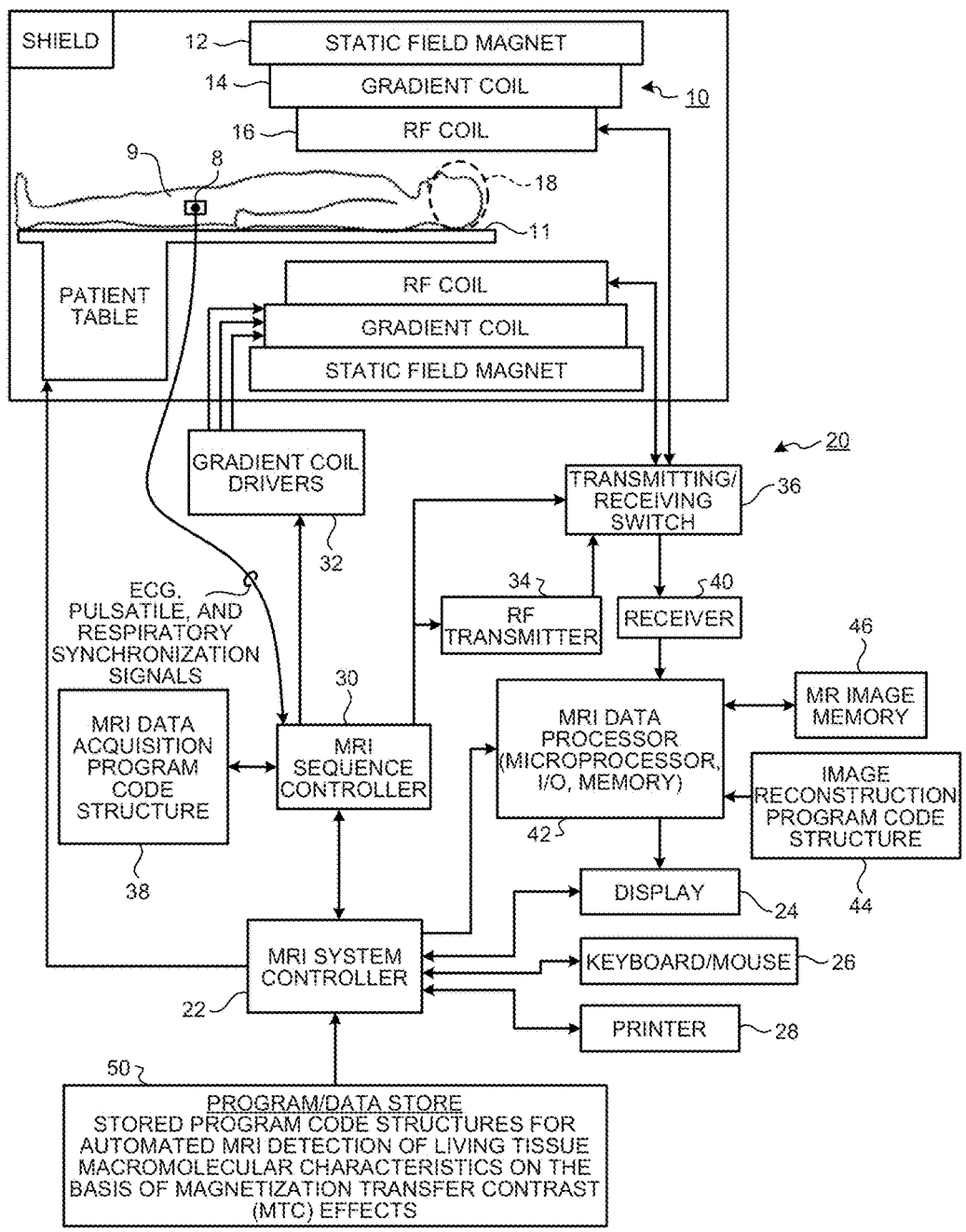
FIG. 1 is a high-level schematic block diagram of an MRI system according to an exemplary embodiment configured to provide automated magnetic resonance imaging (MRI) detection of living tissue macromolecular characteristics using the MTC effects.

FIG. 1 is a high-level schematic block diagram of an MRI system according to an exemplary embodiment configured to provide automated magnetic resonance imaging detection of living tissue macromolecular characteristics using the MTC (Magnetization Transfer Contrast) effects. The MRI system shown in FIG. 1 includes a gantry 10 (shown in schematic cross-section) and various related system components 20 interfaced with the gantry 10. At least the gantry 10 is typically located in a shielded room. The MRI system geometry depicted in FIG. 1 includes a substantially coaxial cylindrical arrangement of a static field $B_o$ magnet 12, a Gx, Gy and Gz gradient coil set 14 and an RF (Radio Frequency) coil assembly 16. Along the horizontal axis of this cylindrical array of elements is an imaging region 18 shown as substantially encompassing the anatomic tissue of interest (i.e., region of interest (ROI)) for a patient 9 (e.g., the head) supported by a patient bed or table 11.

An MRI system controller 22 has input/output ports connected to a display 24, a keyboard/mouse 26 and a printer 28. As will be appreciated, the display 24 may be of the touch-screen variety so that it functions to input control signals as well.

The MRI system controller 22 interfaces with an MRI sequence controller 30. The MRI sequence controller 30 is configured to control the Gx, Gy and Gz gradient coil drivers 32, as well as a RF transmitter 34 and a transmit/receive switch 36 (if the same RF coil is used for both transmission and reception). As those skilled in the art will appreciate, many different types of RF coils (e.g., whole body coils, surface coils, birdcage coils, coil arrays, etc.) may be employed to transmit and/or receive RF signals to/from the ROI in the imaging volume. As will also be appreciated, one or more suitable physiological transducers 8 may be affixed to the patient's body to provide electrocardiogram (ECG), respiratory and/or pulse wave synchronizing signals to the MET sequence controller 30. The MRI sequence controller 30 also has access to suitable program code structure 38 for implementing MRI data acquisition sequences already available in the repertoire of the MRI sequence controller 30—e.g., to generate MR images including MTC effects using operator and/or system inputs defining particular MRI data acquisition sequence parameters.

The MRI system 20 includes an RF receiver 40 providing input to an MRI data processor 42 so as to create processed image data which may be sent to the display 24 (or elsewhere for later viewing). The MRI data processor 42 is also configured for access to an image reconstruction program code structure 44 and to an MR image memory 46 (e.g., for storing MR image data derived from processing in accordance with the exemplary embodiments and the image reconstruction program code structure 44).

Also illustrated in FIG. 1 is a generalized depiction of an MRI system program/data store 50 where stored program code structures (e.g., for MRI detection of living tissue macromolecular characteristics using MTC effects, a related graphical user interface (GUI), operator inputs to same, etc.) are stored in computer readable storage media accessible to the various data processing components of the MRI system. As those in the art will appreciate, an MRI system program/data store 50 may be segmented and directly connected, at least in part, to different ones of processing computers of the various related system components 20 having most immediate need for such stored program code structures in their normal operation (i.e., rather than being commonly stored and connected directly to the MRI system controller 22).

Indeed, as those skilled in the art will appreciate, FIG. 1 is a very high level simplified diagram of a typical MRI system with some modifications so as to practice exemplary embodiments to be described herein below. The system components can be divided into different logical collections of "boxes" and typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs (Central Processing Unit), registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an MR imaging reconstruction process, an array of computer-readable accessible data value storage sites (e.g., multi-digit binary representations of pixel values) in physical storage media will be transformed from some prior state (e.g., all uniform "zero" values or all "one" values) to a new state wherein the physical states at the physical sites of such an array (e.g., of pixel values) vary between minimum and maximum values to represent real physical events and conditions (e.g., the tissues of a patient over an imaged region space). As those in the art will appreciate, such arrays of stored data values represent and also constitute a physical structure—as does a particular structure of computer control program codes that, when sequentially loaded into instruction registers and executed by one or more CPUs of the MRI system, cause a particular sequence of operational states to occur and be transitioned through within the MRI system.

The exemplary embodiments described below provide improved ways to acquire MRI data and/or process MRI data acquisitions and/or to generate and display MR images.

In the above-described MRI system, for example, the MRI sequence controller 30 applies MT (Magnetization Transfer) pulses having a frequency different from the resonance frequency (e.g., center frequency) of free water protons and then acquires MR signals of an object to be imaged. In addition, for example, the MRI sequence controller 30 acquires MR signals for each of multiple frequencies while changing the frequency of the MT pulses within the frequency band based on the T2 relaxation time of restricted protons contained in the object to be imaged.

In a case where the object to be imaged contains at least two restricted protons having different T2 relaxation times, the MM sequence controller 30 changes the frequency of the MT pulses within a wide-range frequency band based on a relatively short T2 relaxation time.

For example, on a basis of a relationship between signal intensity and frequency, the MRI system controller 22 (also referred to as "analyzer") analyzes the MR signals acquired for each of the frequencies to obtain Z-spectra for each range of the analysis. The MRI system controller 22 derives, from the Z-spectra, values about the at least two restricted protons having different T2 relaxation times. For example, at least one of the ratios of the at least two restricted protons and the T2 relaxation times of the at least two restricted protons are derived. Furthermore, the MRI system controller 22 generates an image obtained by mapping colors based on the values about the restricted protons acquired from the Z-spectra on the reconstructed MR image and displays the generated image on the display 24. These aspects will be described in detail below.

It is assumed that proton exchange exists between relatively free water protons and restricted protons in macromolecules. "Z-spectra" measured by magnetic resonance imaging (MRI) has been used to evaluate exchangeable protons. In the brain, the grey matter (GM) and white matter (WM), containing cell bodies and axons with a myelin sheath of neurons, may contribute in different exchangeable environments. In the following exemplary embodiment, we propose that there are at least two exchangeable environments due to ultra-short spin-spin relaxation (T2) in the grey and white matters. In this work, we applied a physical Lorentzian model to MRI Z-spectra and curve-fitted two exchangeable environments in human brains. In our results, we found that the two exchangeable compartments indicate populations of short-T2 exchangeable protons (T2e to 50 μs) and long-T2 exchangeable protons (T2e to 2500 μs) in healthy volunteers. The analysis of short T2e and long T2e may provide a novel dimension of MRI contrast, which was not previously reported.

MTC effects make it possible to observe the interaction of bulk "free" water protons with "restricted" protons in macromolecules of tissues and/or organs having different macromolecular compositions. Thus, depending on macromolecule properties, it is possible to generate MRI contrast in different human tissues using the MTC effect and thus vary MRI contrast. The well-known contrast effects of MTC have been demonstrated in evaluation of morphology of the brain, kidney, myocardium, as well as improvement of contrast between blood and brain parenchyma in intracranial MR angiography (MRA).

The MTC effect has also been further investigated to study the chemical exchange saturation transfer (CEST) of exchangeable protons that resonate at different frequencies from bulk water protons by selectively saturated NMR (Nuclear Magnetic Resonance) nuclei using RF pulses. The major contributors to CEST are, in general, amide, amine and hydroxyl protons, which are MTC exchangeable protons with bulk water protons. The CEST spectra (sometimes called "Z-spectra") are spectra of the MTC effect achieved by plotting the MR signal intensity of free water protons (which decreases with off-resonance RF excitation pulses). An early conception of the MTC effect was that short T2 components of macromolecules, which are not observable in spectroscopy, become observable by detecting a decrease in the signal from free water protons (caused by exchange of magnetization with protons having short T2 components).

The contrast between white and grey matter in brain MRI has been investigated by a number of researchers. It is known that relative brightness of adult white matter in T1-weighted images arises from myelin. However, the mechanisms responsible, remain unknown. Some have conjectured that cholesterol of myelin was responsible.

The neurons have a cell body mainly located in the grey matter and an axon mainly located in the white matter. The axons are surrounded by a myelin sheath. Water protons within the axon should have relatively free movement, whereas water protons within the myelin sheath may be restricted in movement due to many layers of myelin sheathing.

We have hypothesized (and now demonstrated) that there are at least two exchangeable proton components in the exemplary embodiment—one "long T2 component (T2el)" with long T2, which we observe in regular S-spectra, and one "ultra-short T2 component (T2es)" with considerably short T2.

The MTC effect can be observed as a decrease of free water proton NMR response signal. This decrease results from an exchange with macromolecular protons caused by applying an off-resonance (i.e., offset from the Larmer frequency of free water protons) RF excitation pulse. The CEST spectra (sometimes referred to as Z-spectra, especially where protons of water ($H_2O$) are involved) are spectra derived from the MTC effect over a frequency range of about +/−5 ppm (or +1-650 Hz at 3 T). In order obtain a Z-spectrum showing short T2/T2* components or other NMR effects), one needs to acquire a relatively wide frequency range of MTC-affected proton signals. In particular, the NMR magnetization exchangeable proton in macromolecules may have multiple environments. In order to find corresponding multiple frequency components, at least two components including short and long T2/T2* components (or other NMR effects) are visualized—e.g., as on Z-spectral images by curve fitting.

In an exemplary embodiment, a "short" FWHM means a long T2/T2* component, which has about 70% of exchangeable protons. Conversely, a "long" FWHM means a "short" T2/T2* component occupying about 20% of exchangeable protons. The FWHM value is translated in the microsecond range and 100 μs is considered quite short. 200 μs T2/T2* is relatively long. It presently appears that the short T2/T2* component may represent exchangeable protons within the myelin sheath in an axon. The myelin sheath is located in the white matter. The long T2/T2* component is located in the cell body of neurons, which is located mainly in the grey matter of the brain. Thus, they are not normal or diseased.

In prior MTC spectral techniques, one needed to acquire each set of image data by using different offset frequencies for the MTC pulses and then to plot a spectrum by measuring the signal intensity of the region of interest (ROI). From the spectra, interaction of free water with protons of amide, amine and hydroxyl groups can be observed. In addition, MTC effects can be used to investigate restricted proton and free water proton exchanges of NMR magnetization to observe better contrast (or signal reduction in free water ROIs) by irradiating with an off-resonance frequency. However, no investigation of the relationship between restricted protons and free water protons was attempted to find the condition of restricted protons of macromolecules.

It is now believed that the full width at half maximum (FWHM) parameters of MTC-related spectra allow one to evaluate associated relative values of differing macromolecules. Areas of abnormal tissues (e.g., cancer cells) have different spectra as compared to those from normal tissues. By measuring the FWHM of spectra, one can estimate a value (e.g., T1, T2, T2/T2*, etc.) of the abnormal environment.

In order to obtain MTC-related spectra for such purposes, a suitable graphical user interface (GUI) for MTC-related spectra is required to set the desired frequency range, increment of offset frequency and type of MRI data acquisition sequence.

Figure 2:
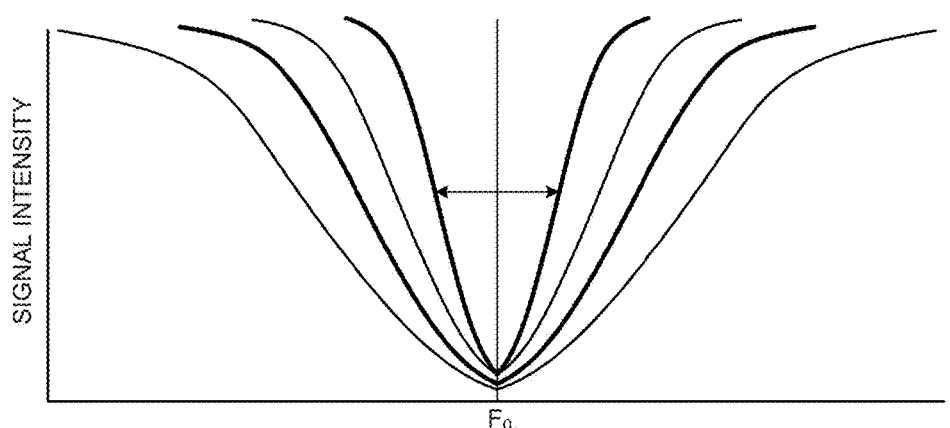
FIG. 2 is a graph of signal intensity versus frequency deviation from the Larmor frequency for an unrestricted nuclear magnetic resonant (NMR) nuclei (i.e., water protons), demonstrating that the full width at half maximum (FWHM) is inversely proportional to the T2 NMR parameter of coupled macromolecules.

After data acquisition, MTC-related spectra of regions of interest are plotted and the FWHM parameters (e.g., 1/FWHM is proportional to, e.g., T2/T2* value for macromolecules) of those spectra are estimated. See, for example, FIG. 2. FIG. 2 is a graph representing, for an unrestricted nuclear magnetic resonance (NMR) nucleus (i.e., a water proton), a relationship between signal intensity and frequency deviation from the Larmor frequency, and FIG. 2 is a graph demonstrating that the full width at half maximum is inversely proportional to the T2 parameter of coupled macromolecules, where the FWHM parameter of a spectral plot represents 1/T2 of a restricted or macromolecular environment.

Figure 3:
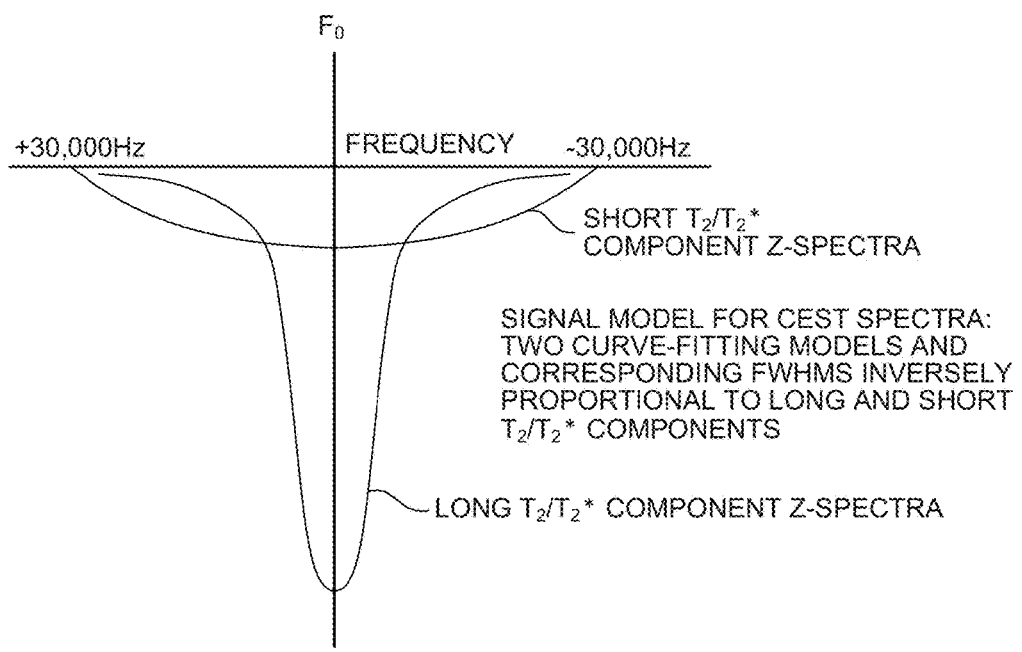
FIG. 3 is a graph depicting two curve-fitting models and their associated "long" and "short" FWHMs (e.g., corresponding to T2/T2*—or, more generally, T2e representing the T2 value of macromolecular protons participating in an MTC-effected exchange) components.

FIG. 3 is a graph depicting two curve-fitting models and their associated "long" and "short" FWHMs (e.g., corresponding to T2/T2*—or, more generally, T2e representing the T2 value of macromolecular protons participating in an MTC exchange) components. As shown in FIG. 3, signal modeling for MTC-related spectra may include two-component curve fitting models and FWHMs, namely to respectively fit both "long" and "short" components (e.g., T1, T2, T2/T2*, etc.).

An exemplary embodiment allows for automated acquisition of MTC-related spectra with a proper desired frequency range, increment of offset frequency and output of MTC-related spectra. After collecting all image data, spectra for voxels of a region of interest (ROI) are calculated from all acquired images. Differentiation and contrast of normal versus abnormal tissue environments can become visually obvious from the acquired and processed images.

Contrary to traditional F-spectrum acquisitions in which the offset frequencies usually range between −6 to +6 ppm, in the exemplary embodiment, we selected a protocol with MT saturation using an expanded range of off-resonance frequencies from −30 kHz to +30 kHz. Fifty-three steps of offset frequencies (3 T) were applied: [30000, 28000:−3000:1000, 750:−50:−750, −1000:−3000:−28000, −30000] Hz. To improve the MTC pulse profile, ten sine pulses with time bandwidth product of eight were implemented in our sequence. The RF pulse duration was 40 ms each. The MTC pulses were inserted as preparation pulses into an FASE 2D base imaging sequence, with TR/TE 8553/60 ms. The flip and flop angles were 90° and 90°, respectively. The in-plane resolution is 1.0 mm×1.1 mm, and the slice thickness is 5 mm. One single imaging slice was acquired for each human subject. Therefore, the total acquisition time for each subject was around ten minutes. For all nine subjects, the imaging slice was placed axially just below the body of corpus callosum. For one of the nine subjects, two more acquisitions were performed at two different imaging positions: one located axially and passed through the third ventricle (at the basal ganglia level); the other one was placed tilted through the cerebellum. The purpose of these two experiments is to confirm that the method proposed in our study was robust to imaging locations.

An exemplary embodiment provides a GUI for acquiring Z-spectra which includes acquisition of Z-spectra images, Z-spectra and calculation of a full width at half maximum (FWHM) parameter of the Z-spectra. The acquisition can be controlled by a selectable spectral width, a selectable increment of off-resonance frequency (e.g., 500 Hz increments from −30,000 Hz to +30,000 Hz, or a smaller increment near F0 with larger increments at frequency offsets >±5,000 Hz). For example, in one embodiment there might be 53 data points acquired by using frequency offsets having varying incremental differences therebetween (e.g., using increments of 2 kHz, 3 kHz, and 50 Hz) with smaller increments towards the middle of the overall 30 kHz to +30 kHz range so that acquired data points are more concentrated near the mid-range where spectral peaks are expected. In other words, in the exemplary embodiment, the MRI sequence controller 30 makes an interval of the frequency of MT pulse changed within the frequency band non-uniform within the frequency band. For example, the MRI sequence controller 30 makes an interval of the frequency of the MT pulse changed within the frequency band short (dense) in a frequency band near the resonance frequency of free water protons and makes it long (sparse) in a frequency band away from the resonance frequency of free water protons.

The following frequency offsets provide, according to an embodiment, an example arrangement having varying incremental differences therebetween with smaller increments towards the middle of the overall −30 kHz to +30 kHz range so that acquired data points are more concentrated near the mid-range where spectral peaks are expected: −30 kHz; −28 kHz; −25 kHz; −22 kHz; −19 kHz; −16 kHz; −13 kHz; −10 kHz; −7 kHz; −4 kHz; −1 kHz; −750 Hz; −700 Hz; −650 Hz; −600 Hz; −550 Hz; −500 Hz; −450 Hz; −400 Hz; −350 Hz; −300 Hz; −250 Hz; −200 Hz; −150 Hz; −100 Hz; −50 Hz; 0 Hz; +50 Hz; +100 Hz; +150 Hz; +200 Hz; +250 Hz; +300 Hz; +350 Hz; +400 Hz; +450 Hz; +500 Hz; +550 Hz; +600 Hz; +650 Hz; +700 Hz; +750 Hz; +1 kHz; +4 kHz; +7 kHz; +10 kHz; +13 kHz; +16 kHz; +19 kHz; +22 kHz; +25 kHz; +28 kHz; and +30 kHz.

The predetermined band of different offset frequencies for the MTC pulses are here much larger than for conventional chemical exchange saturation transfer (LEST) analyses. In particular, the acquisition of MTC-related spectra needed for our exemplary embodiments acquires multiple sets of MRI data across a relatively large range corresponding to expected macromolecular spectra. Ultra-short T2 values can thus be measured and curve-fitted for analysis. For example, for T2=50 μs, a bandwidth of 20 KHz (i.e., ±10 kHz) may be suitable, while for T2=10 μs, a bandwidth of 100 kHz (±50 kHz) would be more suitable.

The MRI data acquisition sequence itself can be virtually any desired sequence (e.g., FASE, EPI, bSSFP, FFE, FE, FSE, SE, etc.), including 2D and 3D sequences. Each image data set for a selected ROI gives MTC-related spectra and FWHMs. After acquiring the spectra, FWHMs of any specified area of the ROI can be calculated to provide, e.g., two T2/T2* values (e.g., long and short ranges) for the macromolecule environments. After collecting all image data, FWHM or tissue values (e.g., T2/T2*) in the region of interest (ROI) are calculated from the acquired images. Preferably, the k-space data is acquired over the designated spectral width as MRI data sets from the same sequence or linked sequences while maintaining substantially constant RF signal receiver gain.

Curve fitting of at least two components (e.g., long and short) in the MTC-related spectra provides short and long T2 components with overlay of T2 amounts on the obtained images. The FWHMs (or, e.g., T2/T2*) of typical expected normal values (short and long) at each organ in normal variation can be used as a reference, while different FWHM (or, e.g., T2/T2*) values can be used to indicate diseased areas.

Figure 4:
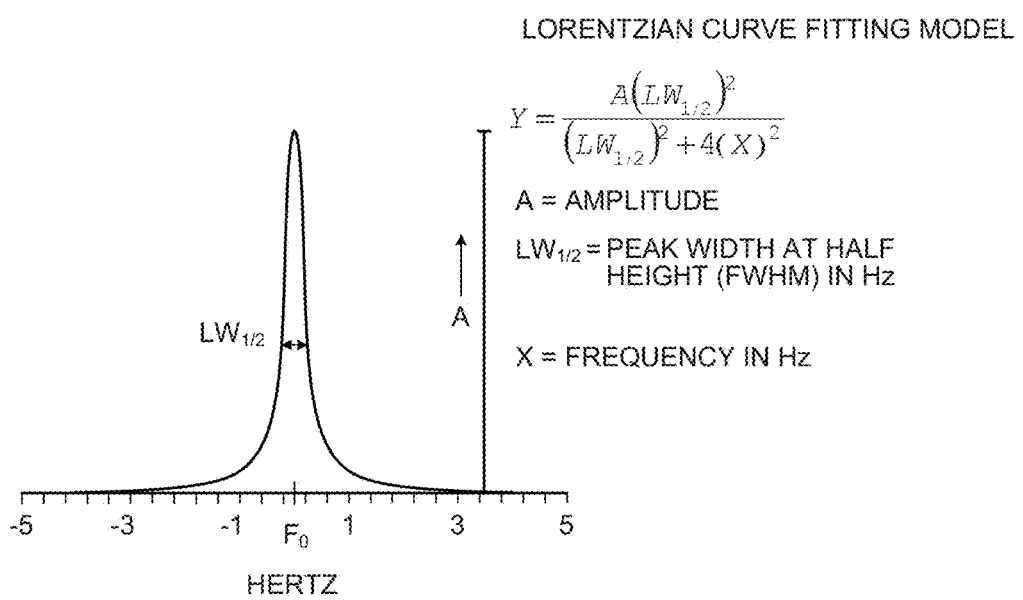
FIG. 4 is another graph of a spectral response curve fitting analysis for determining FWHM.

FIG. 4 is another graph of a spectral response curve fitting analysis for determining FWHM. One possible curve fitting model that has been suggested by others uses a Lorentzian line shape (as depicted in FIG. 4). Since we hypothesize that there are at least two exchangeable proton pools, our two-component model can be described by Equation (1).

$$y = \left( A_1 \frac{LW_1^2}{LW_1^2 + 4x^2} + A_2 \frac{LW_2^2}{LW_2^2 + 4x^2} \right) \quad (1)$$

y: (normalized) measured Z-spectrum
x: offset frequency (−30 to 30 kHz) of MTC pulses
$A_{1/2}$: amplitudes of the long/short T2 exchangeable components
$LW_{1/2}$: FWHMs of the long/short T2 components (and are inversely proportional to T2 values).

To extract the information on two exchangeable proton components, i.e., to estimate $A_{1/2}$ and $LW_{1/2}$, the acquired MR images are curve-fitted to the signal model in Equation (1) using the lsqnonline function in MATLAB (MathWorks, Inc. Natick, Mass.), which solves non-linear least-squares problems. We processed the data in two different ways: in the first approach, three regions of interest (ROIs), i.e., the grey matter, white matter and cerebrospinal fluid (CSF) were segmented in SPM8 (Statistical Parametric Mapping, www-.fil.ion.ucl.ac.uk/spm/). The mean signal in each ROI was calculated and then served as input in Equation (1). In the second approach, the signal was curve-fitted using the Lorentzian line shape in a voxel-by-voxel fashion.

Amplitudes of a "long" T2/T2* pool for young and senior volunteers are depicted in FIG. 5. FIG. 5 is an image showing relative amplitudes of the long T2/T2* pool for young and senior volunteers.

Amplitudes of an ultra "short" T2/T2* pool for young and senior volunteers are depicted in FIG. 6. FIG. 6 is an image showing relative amplitudes of ultra-short T2/T2* pool for young and senior volunteers.

An example of the result of curve fitting and parameter extraction is shown in Table 1 below (where GM=grey matter and WM=white matter).

TABLE 1

| Subjects | | A1 | $LW_1$ (Hz) | $T_2^*$ (µs) | A2 | $LW_2$ (Hz) | $T_2^*$ (µs) |
|---|---|---|---|---|---|---|---|
| Young | GM | 0.77 | 368 | 2713.9 | 0.13 | 11426 | 87.5 |
| | WM | 0.69 | 426 | 2346.9 | 0.23 | 10081 | 99.2 |
| Senior | GM | 0.69 | 329 | 3041.0 | 0.10 | 19362 | 51.6 |
| | WM | 0.68 | 409 | 2442.2 | 0.18 | 7600 | 131.6 |

The example curve fitting result provides long T2* as a majority (around 70%) component, and short T2* as a minority (e.g., about 10-20%) component. The long T2* component of macromolecules shows a relatively high percentage in the grey matter, whereas the short T2* component shows a relatively higher portion in the white matter. In one embodiment, a "short" T2/T2* FWHM range may comprise values less than 100 µs while a "long" T2/T2* FWHM range may comprise values more than 100 µs.

The contents of the above descriptions can be summarized as follows: the exemplary embodiment detects characteristics of macromolecules in living tissues by magnetic resonance imaging using MTC effects and provides a visual output of the result of the detection, thereby provides novel information that can be clinically utilized.

First, in the exemplary embodiment, it is hypothesized that there are at least two macromolecular protons as macromolecular protons that are exchangeable with free water protons. It is hypothesized that, particularly in grey and white matters, there are macromolecular protons with short T2 relaxation time (short T2/T2* components) and macromolecular protons with long T2 relaxation time (long T2/T2* components). The short T2 relaxation time means, for example, 50 µs or less and the long T2 relaxation time means, for example, 2500 µs or less. As described above, in the exemplary embodiment, it is hypothesized that there are macromolecular protons with "ultra" short T2 relaxation time.

In order to detect such short T2/T2* components, in the exemplary embodiment, MT pulses are applied in a completely unconventional wide-range frequency band to acquire Z-spectra for the wide-range frequency band. In other words, Z-spectra are acquired not for the frequency band of about −5 ppm to +5 ppm at most (about −650 Hz to +650 Hz in the case of 3T) but for the frequency band of, for example, −30 kHz to +30 kHz or −50 kHz to +50 kHz, which is a completely different order of magnitude in frequency band from the conventional one. The Z-spectra are, in general, curves of MR signals acquired with the frequency of MT pulses being changed, drawn with the vertical axis representing the signal intensity and the horizontal axis representing the frequency.

In the exemplary embodiment, the frequency band of MT pulses are almost determined according to the expected short T2/T2* components, i.e., the T2 relaxation times and Z spectra have a relationship that the inverse of FWHM (Full Width at Half Maximum) of the Z-spectral curve is the T2 relaxation time. Thus, FWHM of the Z-spectral curve can be determined from the expected short T2/T2* components and the MT pulse frequency band can be determined according to the determined FWHM.

In this manner, in the exemplary embodiment, the MRI system acquires MR signals while changing the MT pulse frequency over a wide range to acquire Z-spectra over the wide-range frequency band. The Z-spectra may be analyzed on a pixel-by-pixel basis (for each pixel or each voxel) or analyzed for each ROI (Region Of Interest) that is set separately. Alternatively, Z-spectra may be categorized into grey matters and white matters and then analyzed.

Subsequently, in the exemplary embodiment, the MRI system separates the acquired Z-spectra into long T2/T2* components and short T2/T2* components, i.e., the Z-spectra acquired over a wide range on the hypothesis that there are short T2/T2* components is nevertheless a single curve. Thus, on the hypothesis that this single curve contains two components, the MRI system separates the acquired Z-spectra into two components.

While the method of such separation is not limited to the examples described here, the exemplary embodiment uses a Lorentzian curve fitting model. In the Lorentzian curve fitting model, as represented in Equation (1), when it is assumed that there are two components, four parameters, that are "$A_1$" and "$A_2$" representing the ratios of long and short T2/T2*components, and "$LW_1$" and "$LW_2$" representing the respective FWHMs, are unknown variables. The measured Z-spectrum "y" and the MT pulse frequency "x" are known and thus, by solving Equation (1), four parameters "$A_1$", "$A_2$", "$LW_1$" and "$LW_2$" can be determined.

In the exemplary embodiment, the MRI system can acquire, for a given slice, information such as the ratios of long and short T2/T2* components and FWHMs (i.e., T2 relaxation times) of the respective long and short T2/T2* components on a pixel by pixel basis. Now, providing the acquired information in a useful manner would be sufficient. As methods for such provision, in the exemplary embodiment, a tabular method and a method of color-mapping of the acquired information onto the acquired MR image itself are proposed.

As the imaging methods being performed in the future by the acquisition method shown in the exemplary embodiment and as the analysis or study on the MRI data acquired there progressing, it will be possible to give clinical views on, such as which case shows normal tissues and which case shows abnormal tissues, based on various types of information acquired in the exemplary embodiment.

FIG. 7 is a flowchart representing a computer program code structure for implementing an exemplary embodiment of automated MRI detection of living tissue macromolecular T2/T2* characteristics using Z-spectra. Normally, examinations carried out by using an MRI system include a set of imaging sequences for acquiring images for various diagnoses (e.g., T1-weighted images, T2-weighted images, cine images, etc.) and a set of pre-sequences that are performed prior to the set of imaging sequences, where the sets of sequences are continuously and sequentially performed with operator's operations and so forth interposed therebetween.

The "macromolecular T2/T2* imaging" shown in FIG. 7 is performed as one of the imaging sequences in the sets of sequences. Needless to say, the image reconstruction processing explained below and the following analysis processing (Z-spectrum calculation, curve fitting, spectral component calculation, color map generation, etc.) are not necessarily performed in a single imaging sequence. For example, it may be performed as one of post-processes after all sets of imaging sequences are performed. The set of pre-sequences includes a sequence for acquiring a positioning image, a sequence for adjusting non-uniformity in the magnetic field, and a sequence for acquiring a coil sensitivity map, etc.

As depicted in FIG. 7, the MRI system enters the macromolecular T2/T2* imaging routine at S700. A desired ROI is defined conventionally at S702. For example, the MRI system acquires head positioning images (e.g., sagittal, coronal and axial images of the head) in pre-sequences, displays the positioning images on the display 24, and receives ROI setting for the head positioning images from the operator. The MRI system may display, instead of the positioning images acquired in the pre-sequences, the head images that are acquired in other image sequences performed before the "macromolecular T2/T2* imaging" as positioning images on the display 24.

Thereafter, at S704, a set of default spectral acquisition parameters may be displayed on the display 24. In other words, the MRI system displays, on the display 24, a GUI like that shown in the box of S708, in order to receive from the operator acquisition parameter settings necessary to perform macromolecular T2/T2* imaging. In the exemplary embodiment, the MRI system pre-stores the default values of these acquisition parameters as pre-set information. Thus, some default values are set for the respective acquisition parameters on the GUI displayed at S704. As the default values, restricted values constrained within the specific absorption rate (SAR) are set. Needless to say, the default setting may employ dummy values or zero if desired in order to compel the operator to input values.

In any event, at S706, the operator is given an opportunity to indicate whether changes in the acquisition parameters displayed on the display 24 are desired. If so, at S708, the MRI system presents the spectral width, increments of frequency offset (uniform or non-uniform in the exemplary embodiment depending upon different points or ranges in the frequency spectrum) to the operator. In the exemplary embodiment, the operator is also given an opportunity to define which type of MEI data acquisition sequence is to be employed and which of 2D and 3D acquisition is to be employed.

In other words, the MRI system displays, on the GUI, the default values of, for example, the spectrum width, that is to say, from how many Hz (starting point) to how many Hz (end point) does the MRI system acquire the MRI data as a frequency of MT pulse, and the MRI system accepts a change for the setting. The MRI system also displays, on the GUI, the default values as to how many Hz does the MRI system set as a frequency offset of MT pulse (an interval to increment a frequency of MT pulse) and the MRI system accepts a change of the setting. Here, in the exemplary embodiment, the MRI system can accept, as the increment, a uniform setting or non-uniform settings over the spectral width. For example, the MRI system may accept non-uniform settings, e.g., using a small increment in a range close to the center of the whole spectral width and using a large increment in a range away from the center.

The MRI system displays choices on which type of pulse sequence is used to acquire MRI data and accepts the setting and a change for the setting. In the example shown in FIG. 7, the MRI system displays, as choices, FASE (Fast Asymmetric Spin Echo), EPI (Echo Planar Imaging), bSSFP (balanced Steady-State Free Precession), FFE (Fast Field Echo), FE (Field Echo), FSE (Fast Spin Echo), and SE (Spin Echo).

Once the operator has set the minimal required inputs at 708, those are displayed again at 704 and the operator is given another chance to change the parameters if desired at 706.

Eventually, the acquisition parameters are set to the operator's satisfaction. The acquisition parameters include, in addition to the acquisition parameters represented in FIG. 7, the flip angle of MT pulses, the number of MT pulses, TR (Repetition Time), the number of slices, and the flip and flop angles of RF pulses that are applied to acquire MRI data. For example, the operator may perform a setting change, e.g., increase the number of slices, at this stage. As described above, even if the default values themselves are set so as not to exceed the limit of SAR, the limit of SAR may be exceeded because of an increase in the number of slices. In such a case, the MRI system according to the exemplary embodiment may keep the FA or the number of MT pulses so as to obtain a desired Z-spectrum and may change the settings of TR, the number of slices, and flip and flop angles of RF pulses applied to acquire MRI data such that the limit of SAR is not exceeded. When changing the settings of TR, the number of slices, and flip and flop angles of RF pulses, the MRI system changes the settings such that such settings are common in acquisition at all frequencies over the spectral width—because correct comparison between frequencies would be difficult if the conditions for acquiring MRI data are not the same.

The control is then passed to S710 where k-space MRI data is acquired for each incremented offset frequency over the selected spectral bandwidth using the setting for the type of data acquisition sequence and on whether it is 2D or 3D, etc. The MRI data acquisition will be described in detail below using FIG. 13.

Once the MRI data has been acquired at each frequency, the process is passed to S712 where acquired k-space MRI data is reconstructed using 2DFT (Fourier Transform) or 3DFT techniques known in the art. The MRI system may start the reconstruction processing concurrently with acquisition of several sets of data after a certain frequency. Thereafter, the MRI system processes the acquired image data at S714 so as to calculate spectral data for the ROI voxels. In the preferred exemplary embodiment, curve fitting techniques are used at S716 so as to identify at least two spectral components for macromolecules participating in the MTC magnetization exchange process. For example, the MRI system may set different ranges of FWHM spectral curves such as "long" and "short" values reflecting different macromolecular structures participating in the CEST process. At S718, in the preferred embodiment, the MRI system calculates the relative amount of these two different spectral components for the ROI (e.g., possibly on a pixel-by-pixel basis which are then compared to find whether there are more short- or more long-valued components found in the pixels/voxels of the designed ROI).

At S720 in FIG. 7, images of short and long T2/T2* components are fused onto an original MR image of the ROI. The resultant composite image is then displayed at S722 (or stored for later display and/or sent to some other locations for similar display/storage). Ultimately, the MRI system exits from the sub-routine at S724. Control is passed back to the calling of higher level operating system or the like.

In the above exemplary embodiments, T2/T2* has been used as an example of MTC-related NMR parameter linked to MTC-affected exchangeable protons. However, other MTC-affected parameters (e.g., T1, T2, etc.) may also be measured. For example, the T2 values for exchangeable protons participating in MTC might be identified by "T2e" or other desired academic terms.

From the above, it should be understood that abnormal tissues (e.g., cancer cells) will have different CEST spectra (or Z-spectra) from those of normal tissues. However, in addition, it should be understood that the expected range of T2e values (and hence the bandwidth of offset frequencies used for data acquisition) may also change as a function of the targeted anatomy (e.g., kidney, liver, etc.).

Nine volunteers (seven males and two females; age range 33-71 years old and mean age 47 years old) underwent the wide-ranged Z-spectrum experiment of the brain. MR experiments were performed on a 3T system (Toshiba, Titan 3T) using a standard body coil transmission and a twelve (or eight)-channel head array receive coil, following a protocol approved by the institutional Review Board. Padding was used to stabilize the subject's head and to reduce movement.

Figure 8A:
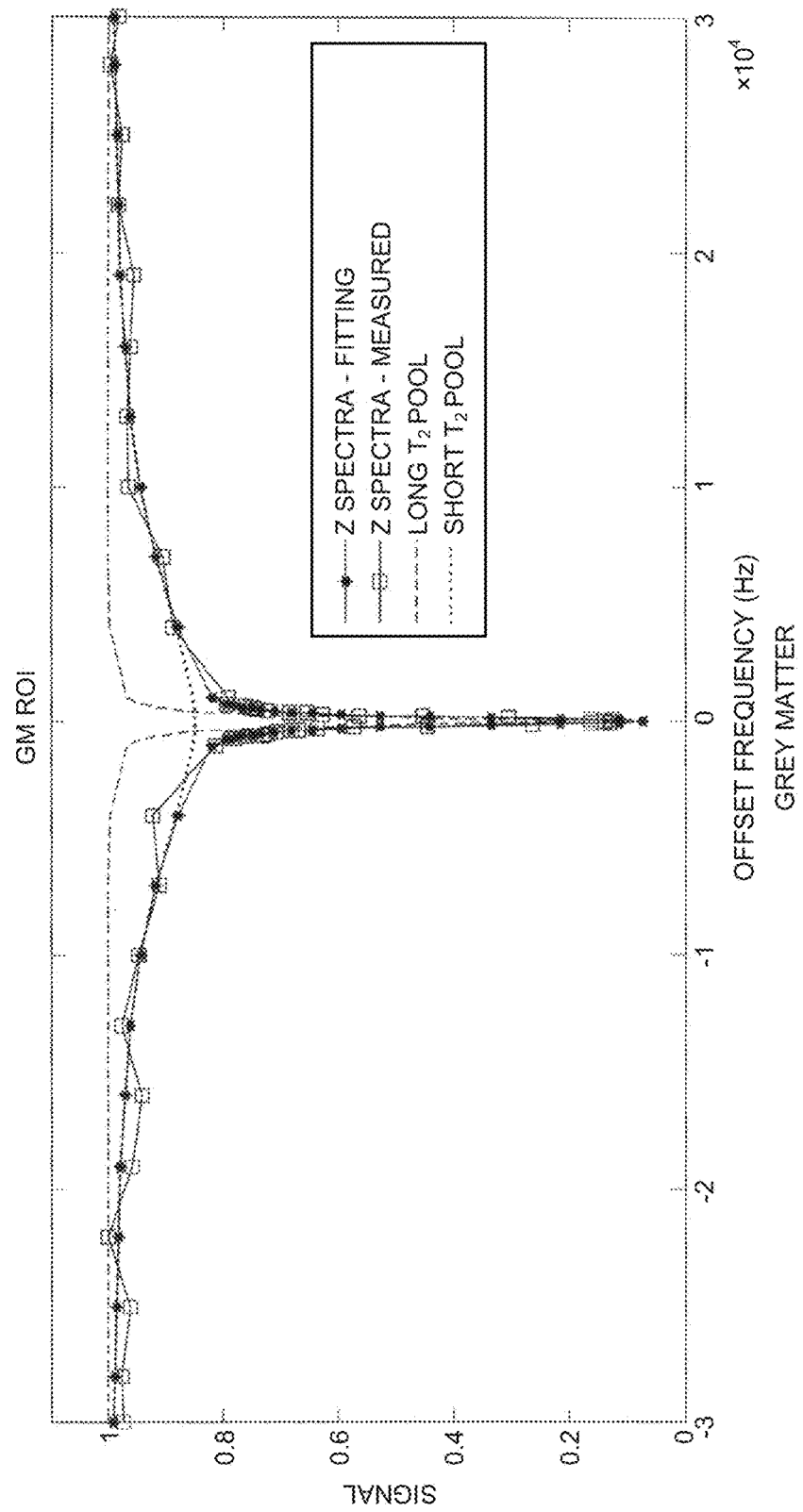
FIG. 8A is a diagram representing Z-spectra of grey matter and curve fitting of short T2es and long T2el exchangeable protons.

FIG. 8A is a diagram representing Z-spectra of grey matter and curve fitting of short T2es exchangeable protons and long T2el exchangeable protons, and FIG. 8B is a diagram representing Z-spectra of white matter and curve fitting of short T2es exchangeable protons and long T2el exchangeable protons.

The grey and white matters were successfully segmented for all nine subjects. FIGS. 8A-8B show an example of the results of curve-fitting of the T2el and T2es components in both grey matter (FIG. 8A) and white matter (FIG. 8B) on one volunteer. One curve stands for the acquired z-spectrum, and the other one is a fitted z-spectrum using the Lorentzian model. The long T2 and short T2 components are shown separately. The measured mean signal in grey matter and white matter are well fitted for all 9 volunteers. In FIGS. 8A-8B, measured z-spectral data points are plotted using squares while the curve-fitted result data points are plotted using filled stars. The grey matter and white matter include two exchangeable proton components, short T2es (shown with dotted line in FIGS. 8A-8B) and long T2el (shown with dashed line in FIGS. 8A-8B).

Figure 9A:
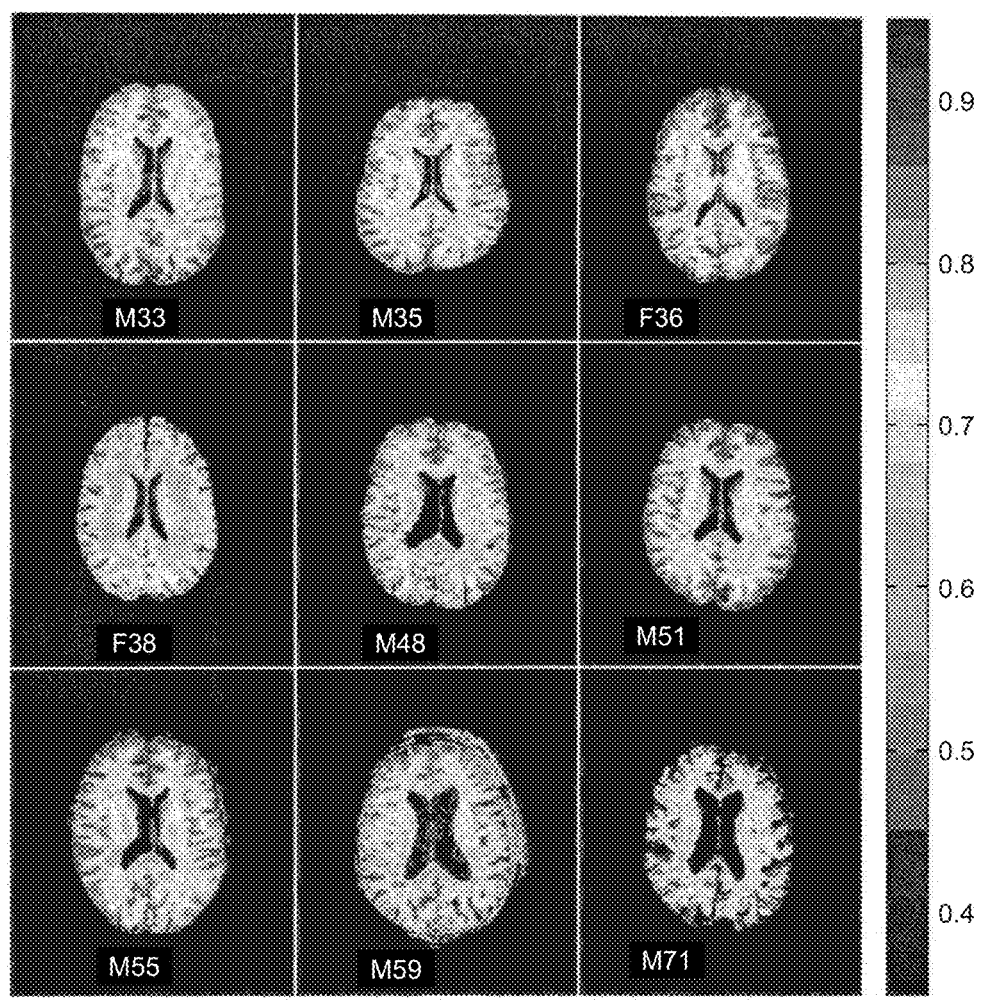
FIG. 9A depicts a T2el color map of nine healthy volunteers.
Figure 9B:
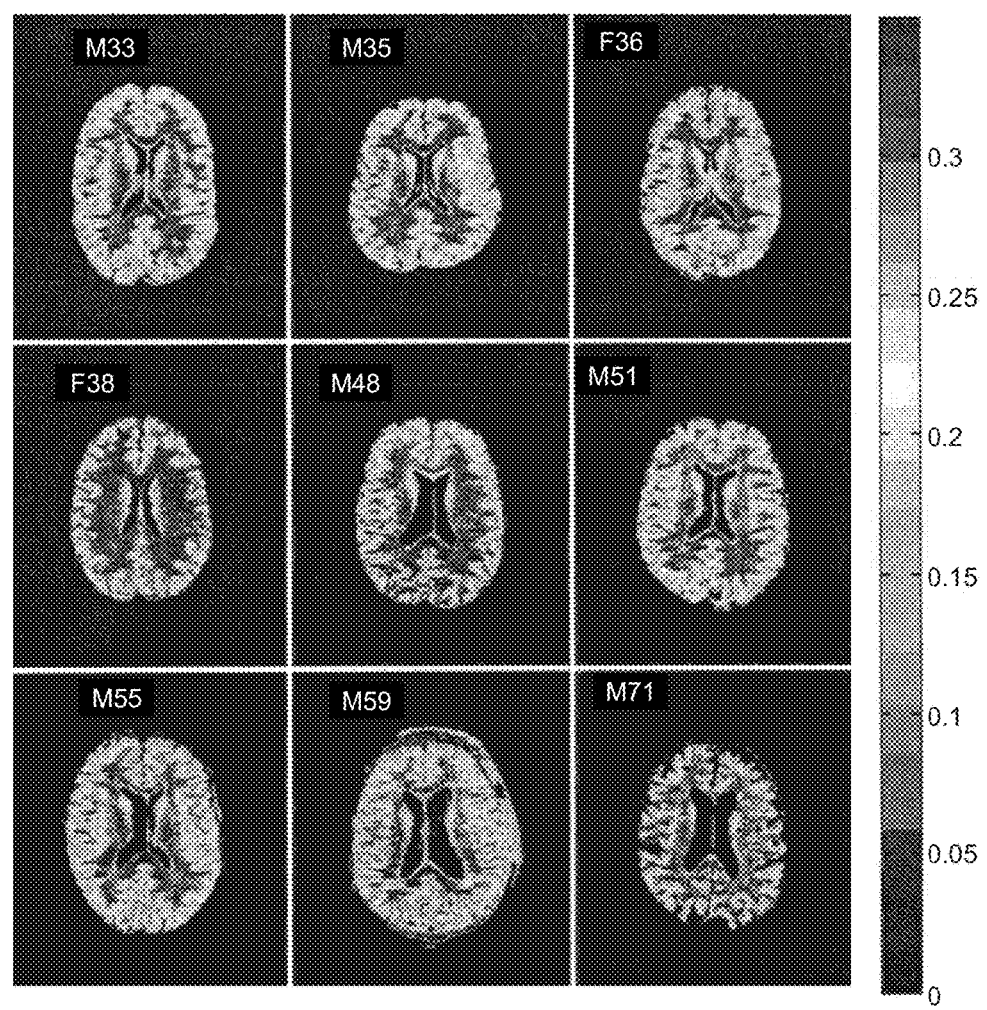
FIG. 9B depicts a T2es color map of nine healthy volunteers.
Figure 9C:
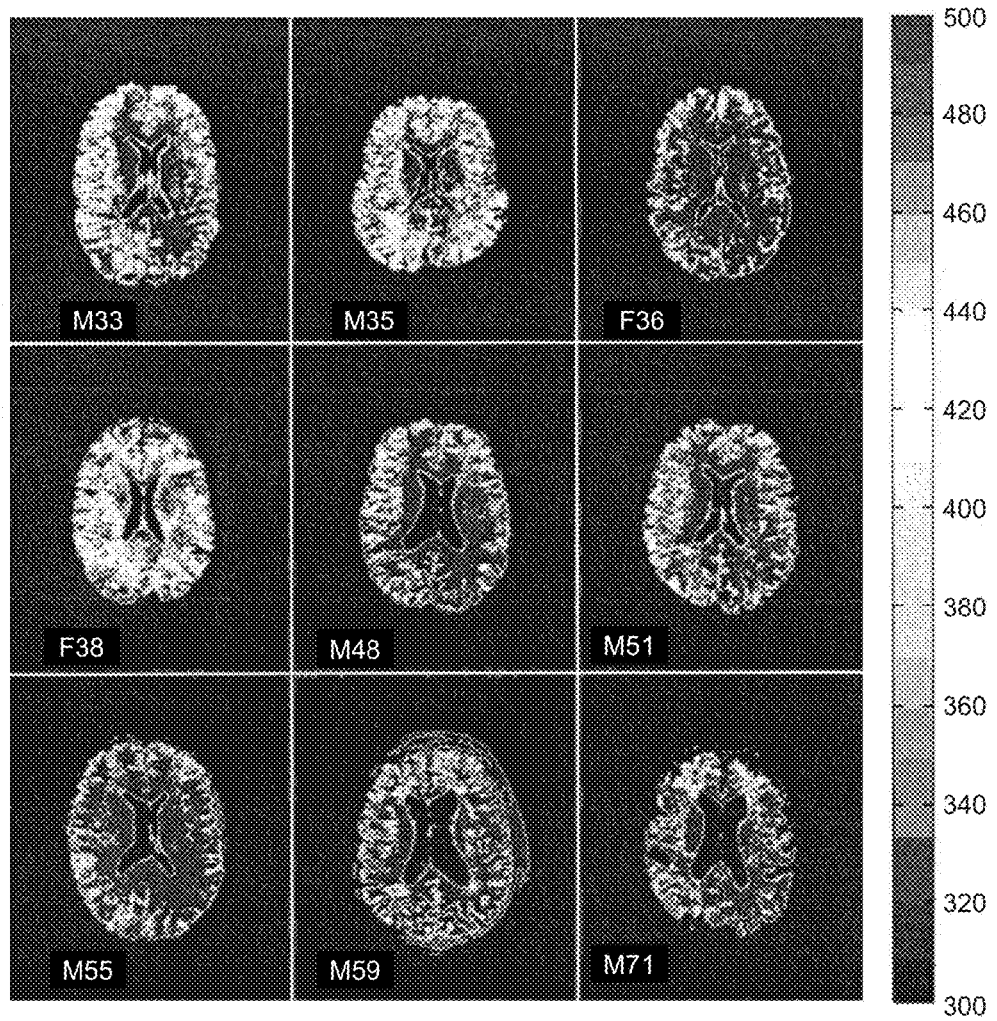
FIG. 9C depicts a T2el full width at half maximum (FWHM) color map of nine healthy volunteers.
Figure 9D:
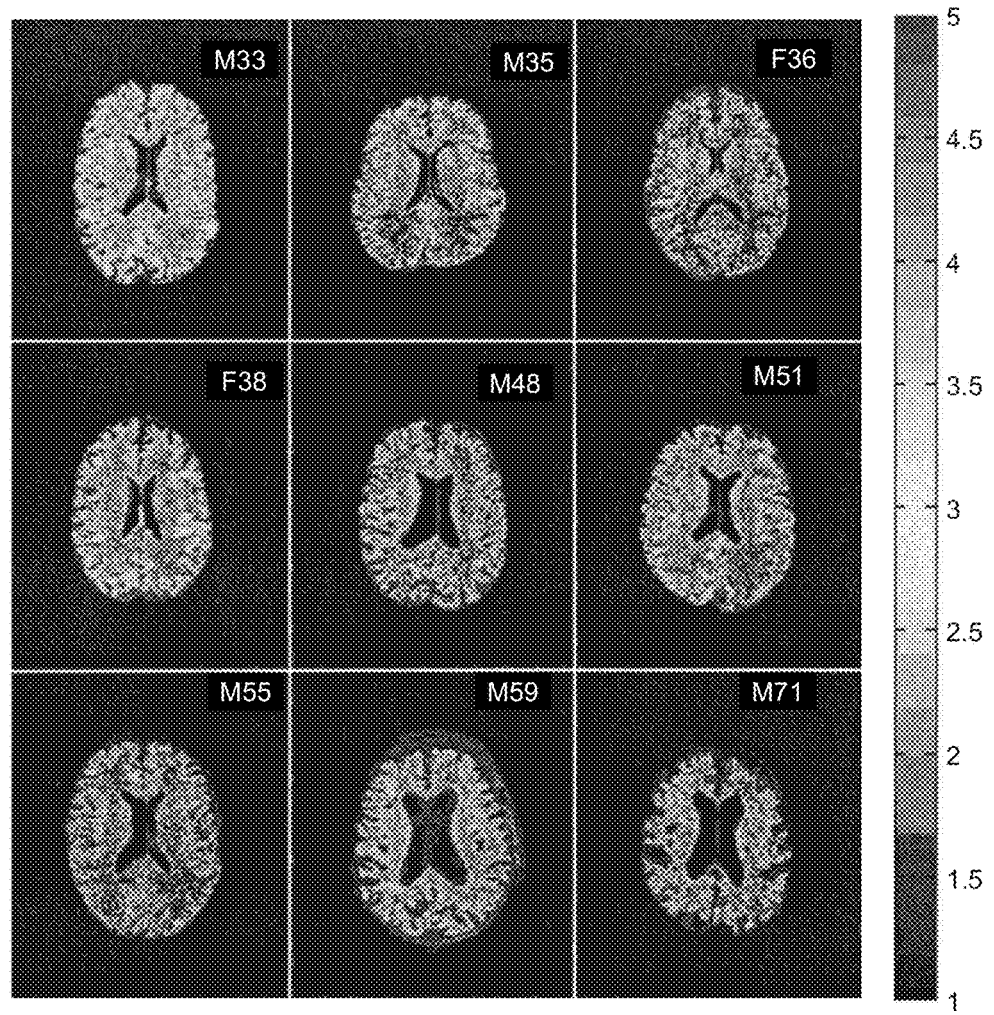
FIG. 9D depicts a T2es full width at half maximum color map of nine healthy volunteers.

FIG. 9A depicts a T2el color map of nine healthy volunteers, FIG. 9B depicts a T2es color map of nine healthy volunteers, FIG. 9C depicts a T2el HWFM color map of nine healthy volunteers, and FIG. 9D depicts a T2es HWFM color map of nine healthy volunteers.

FIGS. 9A-9D represent ratios of T2el (FIG. 9A) and T2es (FIG. 9B), and FWHM (FIGS. 9C and 9D) values in each voxel in nine volunteers. The age of each subject is labeled below each image. The calculated average values of T2el and T2es, and FWHMs of T2el and T2es of the grey and white matters in all nine volunteers, are tabulated in Table 2 and Table 3. The grey matter consists of about 83% T2el and 17% T2es, while the white matter shows 72% T2el and 28% T2es. The percentages of long and short T2 environments in the grey matter are similar for all ages, whereas that of the short T2es component decreases with age.

TABLE 2

| | | | | WM: | | | | |
|---|---|---|---|---|---|---|---|---|
| Sub-jects | Gen-der | Age | A1 | $LW_1$ (Hz) | $T_2^*$ (µs) | A2 | $LW_2$ (Hz) | $T_2^*$ (µs) |
| 1 | M | 33 | 0.71 | 489 | 2045.9 | 0.29 | 18099 | 55.3 |
| 2 | M | 35 | 0.71 | 463 | 2161.4 | 0.29 | 14467 | 69.1 |
| 3 | F | 36 | 0.72 | 511 | 1957.4 | 0.28 | 11264 | 88.8 |
| 4 | F | 38 | 0.69 | 441 | 2268.6 | 0.31 | 16319 | 61.3 |
| 5 | M | 48 | 0.70 | 492 | 2033.4 | 0.30 | 13051 | 76.6 |
| 6 | M | 51 | 0.73 | 488 | 2048.1 | 0.27 | 11907 | 84.0 |
| 7 | M | 55 | 0.72 | 511 | 1955.8 | 0.28 | 11720 | 85.3 |
| 8 | M | 59 | 0.76 | 443 | 2259.2 | 0.24 | 15302 | 65.3 |
| 9 | M | 71 | 0.77 | 443 | 2255.4 | 0.23 | 12964 | 77.1 |
| Mean | | 47.33 | 0.72 | 475.67 | 2109.47 | 0.28 | 13899.22 | 73.64 |
| SD | | 12.95 | 0.03 | 28.70 | 128.49 | 0.03 | 2319.49 | 11.58 |

TABLE 3

| | | | | GM: | | | | |
|---|---|---|---|---|---|---|---|---|
| Sub-jects | Gen-der | Age | A1 | $LW_1$ (Hz) | $T_2^*$ (µs) | A2 | $LW_2$ (Hz) | $T_2^*$ (µs) |
| 1 | M | 33 | 0.83 | 396 | 2524.8 | 0.17 | 27239 | 36.7 |
| 2 | M | 35 | 0.82 | 390 | 2561.2 | 0.18 | 17330 | 57.7 |
| 3 | F | 36 | 0.84 | 456 | 2194.2 | 0.16 | 13557 | 73.8 |
| 4 | F | 38 | 0.79 | 403 | 2480.0 | 0.21 | 23614 | 42.3 |
| 5 | M | 48 | 0.83 | 417 | 2396.0 | 0.17 | 22600 | 44.2 |
| 6 | M | 51 | 0.86 | 396 | 2525.4 | 0.14 | 16792 | 60.0 |
| 7 | M | 55 | 0.83 | 455 | 2197.0 | 0.17 | 14769 | 67.7 |
| 8 | M | 59 | 0.85 | 393 | 2541.3 | 0.15 | 21269 | 47.0 |
| 9 | M | 71 | 0.82 | 362 | 2764.6 | 0.18 | 14294 | 70.0 |
| Mean | | 47.33 | 0.83 | 407.56 | 2464.94 | 0.17 | 19051.56 | 55.49 |
| SD | | 12.95 | 0.02 | 30.76 | 181.04 | 0.02 | 4803.55 | 13.45 |

Figure 10:
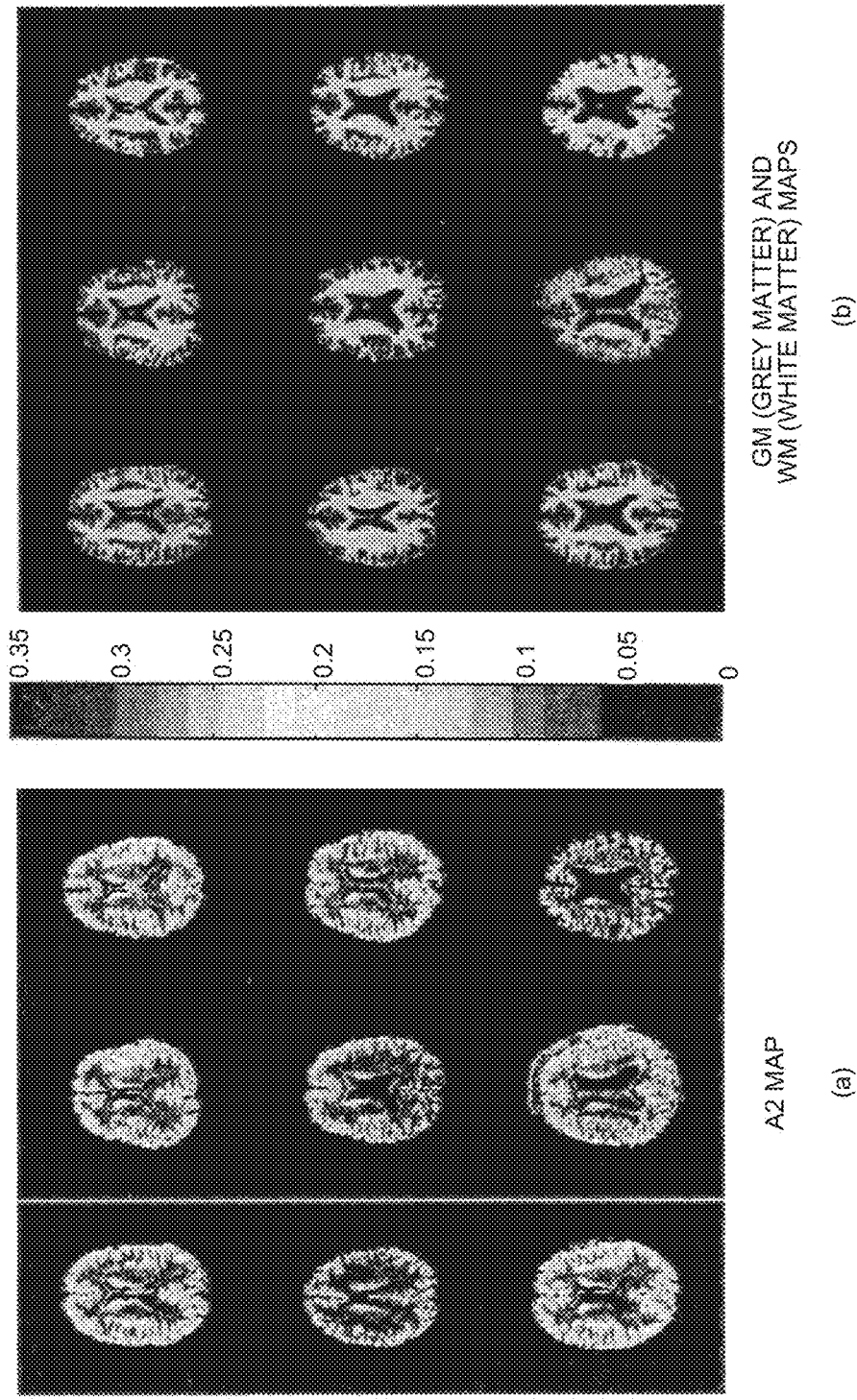
FIG. 10 represents a comparison of a T2es weighted contrast image (a) with imaged segments of grey and white matters (b)
Figure 11:
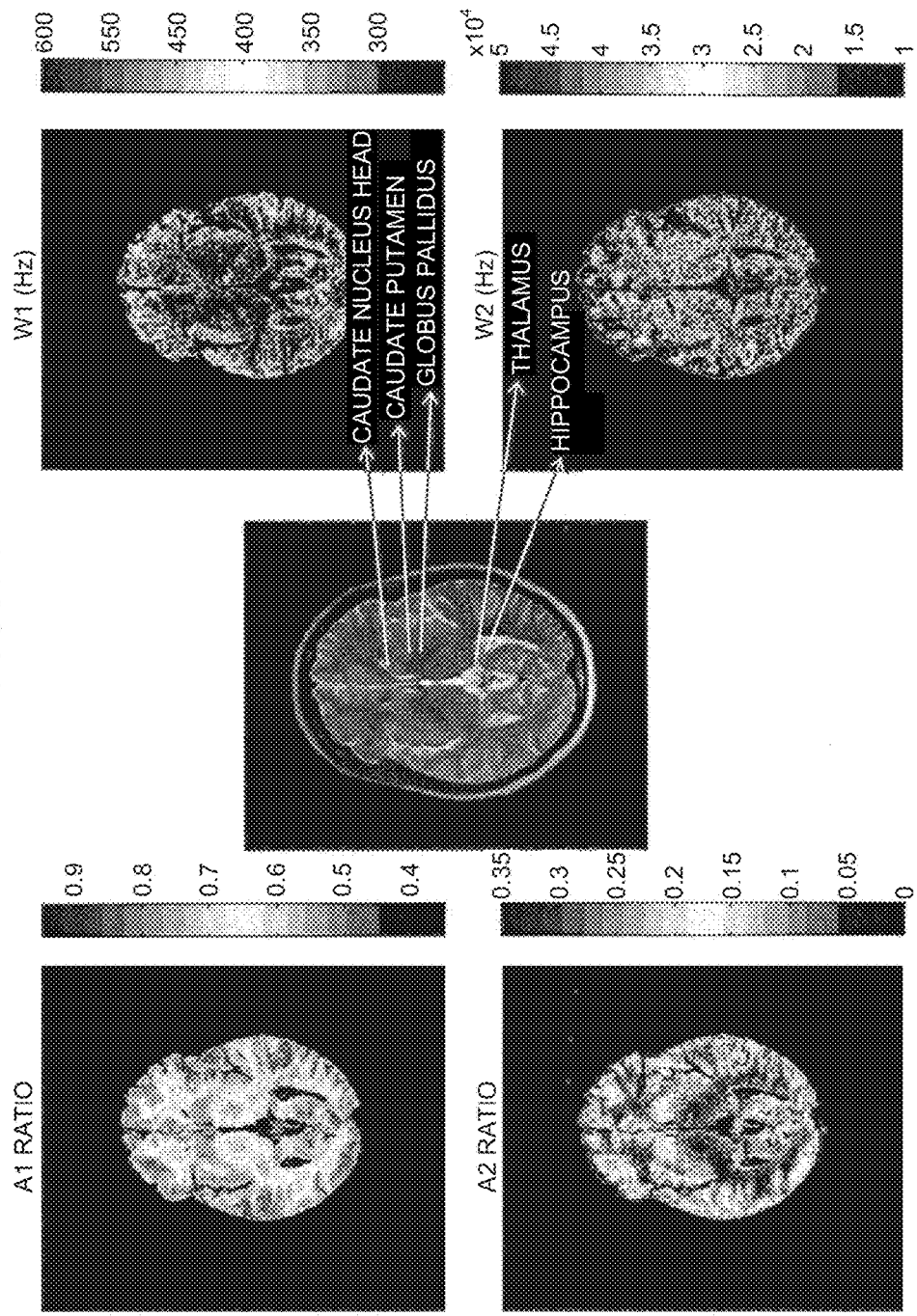
FIG. 11 depicts curve fitted T2el (upper left), T2es (lower left), FWHM of T2el (upper right), and FWHM of T2es (lower right) of the basal ganglia region and also depicts the center reference image (five different brain tissues are labeled: caudate nucleus head, caudate putamen, globus pallidus, thalamus and hippocampus).
Figure 12:
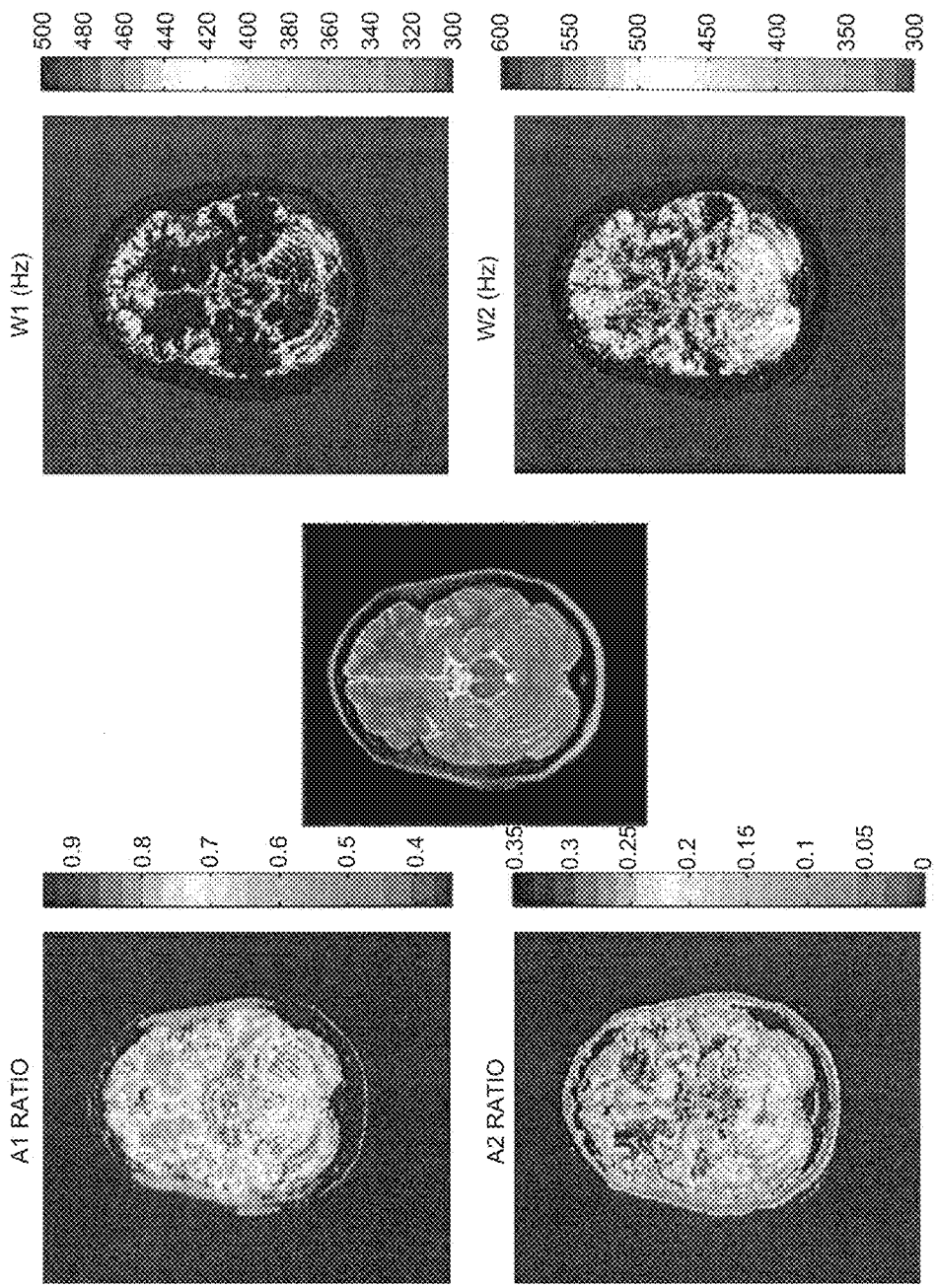
FIG. 12 depicts curve fitted T2el (upper left), T2es (lower left), FWHM of T2el (upper right), and FWHM of T2es (lower right) of the cerebellum region and also depicts a center reference image.

FIG. 10 represents a comparison of (a) T2es weighted contrast images with (b) imaged segments of grey and white matters, and FIG. 11 depicts curve-fitted. T2el (upper left), T2es (lower left), FWHM of T2el (upper right), and FWHM of T2es (lower right) of the basal ganglia region and also depicts the reference image in the center (five different brain tissues are labeled: caudate nucleus head, caudate putamen, globus pallidus, thalamus and hippocampus). FIG. 12 depicts curve fitted T2el (upper left), T2es (lower left), FWHM of T2el (upper right), and FWHM of T2es (lower right) of the cerebellum region and also depicts a reference image in the center.

FIGS. 10(a) and 10(b) demonstrate contrast between grey matters and white matters in T2el-weighted images, which is in good agreement with GM and WM segmented images. FIGS. 11 and 12 show the curve-fitted results, i.e., $A_{1/2}$ and $LW_{1/2}$ maps, at basal ganglia and cerebellum levels, respectively. Five different brain regions are labeled in FIGS. 11 and 12: caudate nucleus head, caudate putamen, globus pallidus, thalamus and hippocampus. Excellent contrast and image quality were obtained at these two locations as well.

We have demonstrated that the short T2es and long T2el values of exchangeable protons of human brains are consistent with grey and white matter segments. It is shown that the grey and white matters contain more T2el components than T2es components. The proportion of short T2es components is larger in the white matter than in the grey matter. We have observed that the white matter contains more short T2es components partly because of the myelin sheath whose sheath layers restrict movement of molecules. The data on the basal ganglia suggests that the grey and white matters have the similar T2e components. The data on the cerebellum represents complicated layers of grey and white matters.

FIG. 13 is a diagram for explaining the pulse sequences implemented in the exemplary embodiment. It has been explained using FIG. 7 that the MRI system acquires MRI data at S710. This aspect will be described in detail below using FIG. 13.

As described above, the MRI system acquires MRI data of a desired ROI (2D or 3D) at each frequency corresponding to offsets that are uniformly or non-uniformly set over a certain spectral width. It has been described that an MRI examination includes sets of sequences consisting of a set of pre-sequences and a set of imaging sequences, and acquisition of MRI data at multiple frequencies in the certain spectral width is performed, for example, as one imaging sequence.

For example, using FIG. 13, an example will be described where MRI data is acquired for 21 frequencies: $-F_{10}$, $F_9$, $-F_8$, $-F_7$, $-F_6$, $-F_5$, $-F_4$, $-F_3$, $-F_2$, $-F_1$, $F_0$, $+F_1$, $+F_2$, $+F_3$, $+F_4$, $+F_5$, $+F_6$, $+F_7$, $+F_8$, $+F_9$, and $+F_{10}$, with the spectral width of from $-F_{10}$ to $F_{10}$ being targeted Needless to say, this example merely represents a relatively simple example for convenience of explanation. As described above, increments may be non-uniform and the number of frequencies for which acquisition is performed may be other than 21, e.g., may be 53, etc. In other words, the spectral width, the number of frequencies, increments may be changed appropriately according to the region of interest or a patient of interest.

Pulse sequences shown in FIG. 13 are pulse sequences for acquiring MRI data at a certain frequency. The pulse sequences for acquiring MRI data at the certain frequency are divided into a "MT pulse sequence part" for applying MT pulses and an "acquisition sequence part" for acquiring MRI data. FIG. 13 shows an example where the MRI system sequentially applies multiple MT pulses with a flip angle of $\alpha°$ that causes MTC effects for the certain frequency in the "MT pulse sequence part" and then applies RF pulses in the "acquisition sequence part" to acquire MRI data.

The flip angle of one MT pulse is set to a value obtained by dividing the flip angle necessary for the desired MTC effects by the number of MT pulses contained in the whole set of MT pulses such that the desired MTC effects are caused by the whole set of MT pulses. The number of MT pulses is also properly set according to the relationship between MTC effects caused by the whole set of MT pulses and the image capturing time. The method where multiple MT pulses are applied sequentially has been described using FIG. 1 but embodiments are not limited to this, and a method where one MT pulse having a large flip angle is applied may be used. Alternatively, MT pulses may be applied for a selected or unselected slice.

By repeatedly performing, for multiple frequencies, the pulse sequences for acquiring MRI data at a certain frequency, the MRI system acquires MRI data necessary for the analysis in the latter stage. Here, the order of implementing pulse sequences for multiple frequencies while changing the frequency of MT pulses will be described.

For example, the MRI system can repeatedly implement the pulse sequences while changing the frequency of MT pulses along the order of frequencies sequentially from the frequency on one side. For example, as shown in FIG. 13 (a), the MRI system implements the pulse sequences sequentially for the 21 frequencies from "$-F_{10}$" to "$+F_{10}$".

For example, the MRI system can implement the pulse sequences sequentially, for example, in the reverse order from "$+F_{10}$" to "$-F_{10}$".

Alternatively, for example, on the hypothesis that the signal value on the negative frequency side and the signal value on the positive frequency side are symmetrical, the MRI system may implement the pulse sequences for only one of the negative frequencies and the positive frequencies. For example, as shown in FIG. 13(b), the MRI system implements the pulse sequences sequentially for 11 frequencies. It is satisfactory if, in an analysis in the latter stage, the MRI system symmetrically applies the curve obtained from the signals acquired for the negative frequencies to the signals acquired for the positive frequencies. Such acquisition can reduce the image capturing time, which is preferable from the viewpoint of SAR. For example, the MRI system may implement pulse sequences sequentially for the positive frequencies from "$F_0$" to "$F_{10}$".

For example, instead of repeatedly implementing the pulse sequences while changing the frequency of MT pulses in the descending order of frequencies, the MRI system may repeatedly implement the pulse sequences while changing the frequency of MT pulses in the ascending order of frequencies. For example, as shown in FIG. 13(c), the MRI system may implement the pulse sequences sequentially from "$F_0$" to "$-F_{10}$". Alternatively, for example, the MRI system may implement the pulse sequences sequentially for the positive frequencies from "$F_0$" to "$+F_{10}$".

Furthermore, for example, the MRI system may not only perform acquisition while changing the frequency sequentially but also perform acquisition while traversing the frequency between the positive and negative frequencies as shown in FIG. 13(d) such that acquisition at adjacent frequencies or frequencies that are close to each other is not performed sequentially. Alternatively, for example, when performing acquisition at positive or negative frequencies, the MRI system may implement the pulse sequences in the order shown in FIG. 13(e). Alternatively, although it is not shown, the order of frequencies may start from "$F_0$" and be traversed between positive and negative frequencies or may be at random.

If acquisition at adjacent frequencies or frequencies that are close to each other is performed sequentially, unless TR is chosen to be sufficiently long, the effects of the MT pulses applied at the frequency in the previous stage may influence on acquisition of MRI data at the frequency in the next stage. Thus, if shortening of TR is preferable, it is preferable that pulse sequences be implemented in an order such that acquisition at adjacent frequencies or frequencies that are close to each other be not executed sequentially, as described above Reducing TR can also contribute to reducing the image capturing time.

The orders shown in FIG. 13 are mere examples. Orders other than the exemplified orders may be similarly used. Furthermore, "the acquisition sequence part" is not limited to the example shown in FIG. 13 and various pulse sequences may be used.

A magnetic resonance imaging (MRI) method includes:

(a) acquiring k-space data for a patient region of interest (ROI) over a predetermined band of RF frequencies using RF excitation pulses having respectively corresponding RF frequencies incrementally offset from a Larmor frequency for free water protons, the RF frequencies being different offset frequencies in which target macromolecule responses are expected and processing the acquired data into spectral data for voxels of the ROI;

(b) analyzing the spectral data to provide spectral peak width in the ROI for macromolecules participating in MTC effects; and (c) staring and/or displaying data representative of ROI tissue values different between different tissues.

(1) A magnetic resonance imaging (MRI) system including: an MRI gantry having static and gradient magnet assemblies and at least one radio frequency (RF) coil defining an image volume into which a patient region of interest (ROI) can be disposed; and MRI control circuits connected to control components within the MRI gantry and configured to effect MRI data acquisition sequences of RF and gradient magnetic pulses which elicit MRI signals from patient tissue when an ROT is disposed therein, to acquire and process the elicited MRI signals into MR image data;

the MRI control circuits being configured to (a) acquire k-space data for a patient ROI over a predetermined band of RF frequencies using RF excitation pulses having respectively corresponding RF frequencies incrementally offset from a Larmor frequency for free water protons, the RF frequencies being different offset frequencies in which target macromolecule responses are expected;

(b) analyze the acquired k-space data to provide spectral peak width data in the ROI for macromolecules participating in MTC effects; and (c) store and/or display data representative of ROI tissues having macromolecules participating in the MTC effects.

(2) The MRI system according to (1), wherein the spectral peak width data is based on calculation of full width at half maximum (FWHM) values.

(3) The MRI system according to (2), wherein the MRI control circuits are configured to distinguish between the FWHM values as being associated with normal tissue or as being associated with diseased tissue.

(4) The MRI system according to (3), wherein the MRI control circuits define at least two ranges of FWHM values including a first range of FWHM values that is larger than a second range of FWHM values, one of the ranges being associated with diseased tissue and the other range being associated with normal tissue.

(5) The MRI system according to (4), wherein the MRI control circuits are configured to detect a short FWHM value of (a) less than 500 microseconds, corresponding to a frequency range of ±1,000 Hz and (b) less than 50 microseconds, corresponding to a frequency range of ±10,000 Hz.

(6) The MRI system according to (1), wherein the MRI control circuits are configured to provide a graphical user interface (GUI) allowing an operator to choose a spectral bandwidth and increments of frequency offset therewithin to be used in acquiring k-space data for the patient ROI as data sets from the same sequence or linked sequences with substantially constant receiver gain.

(7) The MRI system according to (6), wherein the GUI allows the operator to choose non-uniform increments of frequency offset.

(8) The MRI system according to (1), wherein the MRI control circuits are configured to analyze the acquired data by performing curve fitting to acquired data points.

(9) The MRI system according to (1), wherein the MRI control circuits are configured to overlay pixel data representing the MTC effects onto respectively corresponding pixels of a reconstructed MR image.

(10) The MRI system according to (1), wherein the MRI control circuits are configured to calculate for an ROI a relative amount of (a) a first range of spectral peak width data and (b) a second range of spectral peak width data and to generate an image of the ROI with a visually discernable characteristic corresponding to the calculated relative amount.

(11) The MRI system according to (10), wherein the MRI control circuits are configured to generate an image of the ROI with one of two visually discernable characteristics based on whether said relative amount is above or below a predetermined threshold.

(12) The MRI system according to (4), wherein the first range of FWHM values is larger than 100 μs and the second range is less than 100 μs.

In the exemplary embodiments described above, examples where the MRI system performs acquisition of MRI data and analysis using the acquired data have been described. However, embodiments are not limited to these. For example, an image processing apparatus other then MRI systems may perform the above-described process of analysis. In other words, an image processing apparatus may have the same functions as those of the above-described analyzer to perform calculation of Z-spectra, curve-fitting, calculation of spectral components, generation of color maps, etc., by using the data acquired by the MRI system. The image processing apparatus may be, for example, a work station, an image store device (image server) or a viewer of a PACS (Picture Archiving and Communication System), an electronic health record system, etc.

The magnetic resonance imaging device according to at least one of the above-described embodiments can detect living tissue macromolecular characteristics by using magnetic transfer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit the inventions.

What is claimed is:

1. A magnetic resonance imaging apparatus comprising:
a sequence controller configured to apply MT (Magnetization Transfer) pulses having a frequency different from a resonance frequency of free water protons and then acquire magnetic resonance signals of an object to be imaged, wherein the sequence controller acquires the magnetic resonance signals for each of multiple frequencies while changing the frequency of the MT pulses within a frequency band based on a T2 relaxation time of restricted protons contained in the object to be imaged and, in a case where the object to be imaged contains at least two restricted protons having different T2 relaxation times, the sequence controller being configured to perform said changing the frequency of the MT pulses within a wide-range frequency band determined based on a shorter one of the T2 relaxation times of the at least two restricted protons having different T2 relaxation times.

2. A magnetic resonance imaging apparatus comprising:
a sequence controller configured to apply MT (Magnetization Transfer) pulses having a frequency different from a resonance frequency of free water protons and then acquire magnetic resonance signals of an object to be imaged, wherein the sequence controller acquires the magnetic resonance signals for each of multiple frequencies while changing the frequency of the MT pulses within a frequency band configured based on a shorter one of T2 relaxation times of at least two restricted protons having different T2 relaxation times contained in the object to be imaged;

an analyzer configured to analyze the magnetic resonance signals acquired for each of the frequencies on a basis of a relationship between signal intensity and frequency to obtain Z-spectra for each range of analysis, wherein the analyzer derives, from the Z-spectra, values about the at least two restricted protons having T2 relaxation times different from each other.

3. The magnetic resonance imaging apparatus according to claim 2, wherein the analyzer applies curve fitting to the Z spectra to obtain curves respectively corresponding to the at least two restricted protons having different T2 relaxation times.

4. The magnetic resonance imaging apparatus according to claim 2, wherein the analyzer derives, as values about the restricted protons, at least one ratio of the at least two restricted protons and the T2 relaxation times for the respective at least two restricted protons.

5. The magnetic resonance imaging apparatus according to claim 2, wherein the analyzer generates an image obtained by mapping colors based on the values about the restricted protons acquired from the Z-spectra on a magnetic resonance image reconstructed from the magnetic resonance signals and displays the generated image on a display.

6. The magnetic resonance imaging apparatus according to claim 1, wherein the sequence controller makes an interval of the frequency of the MT pulse that is changed within the frequency band non-uniform within the frequency band.

7. The magnetic resonance imaging apparatus according to claim 1, wherein the sequence controller makes an interval of the frequency of the MT pulse that is changed within the frequency band short in a frequency band being near a resonance frequency of the free water protons and long in a frequency band being away from a resonance frequency of the free water protons.

8. The magnetic resonance imaging apparatus according to claim 1, wherein the sequence controller acquires the magnetic resonance signals while changing the frequency of MT pulses either within a positive frequency band or within a negative frequency band.

9. The magnetic resonance imaging apparatus according to claim 2, wherein the sequence controller makes an interval of the frequency of the MT pulse that is changed within the frequency band non-uniform within the frequency band.

10. The magnetic resonance imaging apparatus according to claim 2, wherein the sequence controller makes an interval of the frequency of the MT pulse that is changed within the frequency band approximately 100 µs in a frequency band being near a resonance frequency of the free water protons and approximately 200 µs in a frequency band being away from a resonance frequency of the free water protons.

11. The magnetic resonance imaging apparatus according to claim 2, wherein the sequence controller acquires the magnetic resonance signals while changing the frequency of MT pulses either within a positive frequency band or within a negative frequency band.

12. The magnetic resonance imaging apparatus according to claim 2, wherein a first one of the at least two restricted protons has a short T2 relaxation time of 100 µs or less and a second one of the at least two restricted protons has a long T2 relaxation time of more than 200 µs.

13. A magnetic resonance imaging apparatus comprising:
a sequence controller configured to apply MT (Magnetization Transfer) pulses having a frequency different from a resonance frequency of free water protons and then acquire magnetic resonance signals of an object to be imaged, wherein the sequence controller acquires the magnetic resonance signals for each of multiple frequencies while changing the frequency of the MT pulses within a frequency band configured based on a shorter one of T2 relaxation times of at least two restricted protons having different T2 relaxation times contained in the object to be imaged;
an analyzer configured to analyze the magnetic resonance signals acquired for each of the frequencies on a basis of a relationship between signal intensity and frequency to obtain a Z-spectrum, wherein
the analyzer analyzes the Z-spectrum, hypothesizing that the Z-spectrum is a sum of at least two T2 components.

* * * * *